United States Patent
Takiguchi et al.

(10) Patent No.: US 8,337,104 B2
(45) Date of Patent: Dec. 25, 2012

(54) DEVELOPING APPARATUS, DEVELOPING METHOD AND STORAGE MEDIUM

(75) Inventors: Yasushi Takiguchi, Kumamoto (JP); Taro Yamamoto, Kumamoto (JP); Hiroshi Arima, Kumamoto (JP); Kousuke Yoshihara, Kumamoto (JP); Yuichi Yoshida, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 140 days.

(21) Appl. No.: 13/024,430

(22) Filed: Feb. 10, 2011

(65) Prior Publication Data

US 2011/0200952 A1 Aug. 18, 2011

(30) Foreign Application Priority Data

Feb. 15, 2010 (JP) .................. 2010-030532

(51) Int. Cl.
*G03D 5/00* (2006.01)
(52) U.S. Cl. ...................................................... 396/611
(58) Field of Classification Search .................... 396/611
See application file for complete search history.

(56) References Cited

U.S. PATENT DOCUMENTS

| | | | | |
|---|---|---|---|---|
| 6,848,625 | B2 * | 2/2005 | Takekuma et al. ............... 239/1 |
| 8,043,657 | B2 * | 10/2011 | Yoshihara et al. ............ 427/240 |
| 2003/0180471 | A1 * | 9/2003 | Takekuma et al. ............ 427/421 |
| 2009/0291399 | A1 * | 11/2009 | Yamamoto ..................... 430/324 |
| 2012/0034792 | A1 * | 2/2012 | Yoshihara et al. ............ 438/778 |

FOREIGN PATENT DOCUMENTS

| | | |
|---|---|---|
| JP | 04-097526 A | 3/1992 |
| JP | 2005-277268 A | 10/2005 |
| JP | 2011-166086 A | 8/2011 |
| JP | 2011-166088 A | 8/2011 |

OTHER PUBLICATIONS

Japanese Office action for 2010-030532 dated Jan. 31, 2012.

* cited by examiner

*Primary Examiner* — Rodney Fuller
(74) *Attorney, Agent, or Firm* — Pearne & Gordon LLP

(57) ABSTRACT

There is provided a developing apparatus and a developing method capable of rapidly forming a liquid film of a developing solution on an entire surface of a substrate while reducing a usage amount of the developing solution. The developing apparatus includes an airtightly sealed processing vessel that forms a processing atmosphere therein; a temperature control plate that is provided within the processing vessel and mounts the substrate thereon; an atmosphere gas supply unit that supplies an atmosphere gas including mist and vapor of a developing solution onto a surface of the substrate within the processing vessel; and a first temperature control unit that controls the temperature control plate to a temperature allowing the atmosphere gas to be condensed on the substrate. Here, an inner wall of the processing vessel is maintained at a temperature at which the atmosphere gas is hardly condensed on the inner wall.

11 Claims, 19 Drawing Sheets

WAFER W1

WAFER W2

WAFER W3

WAFER W1

WAFER W2

WAFER W3

WAFER W1

WAFER W1

WAFER W2

WAFER W2

DEVELOPING APPARATUS, DEVELOPING METHOD AND STORAGE MEDIUM

CROSS-REFERENCE TO RELATED APPLICATION

This application claims the benefit of Japanese Patent Application No. 2010-030532 filed on Feb. 15, 2010, the entire disclosures of which are incorporated herein by reference.

FIELD OF THE INVENTION

The present disclosure relates to a developing apparatus and a developing method for developing a substrate of which surface is coated with resist and exposed to light and also relates to a storage medium storing a computer program for implementing the developing method.

BACKGROUND OF THE INVENTION

In a conventional developing process for photoresist (hereinafter, simply referred to as "resist"), a developing solution is supplied through a nozzle onto a surface of a semiconductor wafer (hereinafter, simply referred to as a "wafer") that has been coated with resist and exposed to light via a preset pattern. To obtain process uniformity in a wafer surface, the developing solution is supplied such that a liquid film is uniformly formed on the entire surface of the wafer, and the resist is dissolved by the liquid film.

To form the liquid film of the developing solution, there is known a method (puddle type developing process) for accumulating liquid on the entire surface of the wafer by discharging the developing solution onto the stationary wafer while moving a nozzle having an elongated discharge port, or there is known a method (puddless type developing process) for supplying the developing solution in, e.g., a diametric direction of the wafer while rotating the wafer around a vertical axis and coating the developing solution on the wafer by a centrifugal force.

In consideration of the composition of materials of the resist, a reaction between the developing solution and the resist may progress for a relatively short time. In the aforementioned methods, however, a great amount of developing solution has been used to form a uniform liquid film, and a great amount of time has been taken to supply the developing solution onto the wafer. Since the process of supplying the developing solution is so time-consuming, a certain amount of time, e.g., about 30 seconds to about 60 seconds has been required till the reaction between the developing solution and the resist is completed after the supply of the developing solution is begun.

Meanwhile, a liquid immersion exposure process may be performed as an exposure process for a wafer. To suppress an influence of a liquid used in this liquid immersion exposure process upon the wafer, a high water-repellent resist tends to be used. If the high water-repellent resist is used, however, some portions on the resist may not be wet with the developing solution when the resist is developed by the aforementioned methods. Accordingly, to form a uniform liquid film of the developing solution for the high water-repellent resist, a greater amount of developing solution may be required, which may cause increase of processing cost and supply time for the developing solution. As a result, high throughput of a coating and developing apparatus may not be achieved.

In Patent Document 1, it is disclosed that mist of a developing solution is supplied into a chamber accommodating a substrate therein. The substrate is supported by a hot plate with a certain gap maintained therebetween, and a temperature of the substrate is adjusted by the hot plate. In this method, the temperature of the substrate is set to be lower than a temperature of the mist of the developing solution such that a liquid film of the developing solution is formed by condensing the developing solution on a surface of the substrate. However, Patent Document 1 does not mention anything about a method for condensing vapor of the developing solution on a substrate mounted on a temperature control plate.

Patent Document 1: Japanese Patent Laid-open Publication No. 2005-277268 (paragraphs [0139] and [0141])

BRIEF SUMMARY OF THE INVENTION

In view of the foregoing, the present disclosure provides a developing apparatus and a developing method capable of rapidly forming a liquid film of a developing solution on an entire surface of a substrate while reducing a usage amount of the developing solution, and the present disclosure also provides a storage medium storing a computer program for implementing the developing method.

In accordance with one aspect of the present disclosure, there is provided a developing apparatus that develops an exposed substrate. The developing apparatus includes an airtightly sealed processing vessel that forms a processing atmosphere therein; a temperature control plate that is provided within the processing vessel and mounts the substrate thereon; an atmosphere gas supply unit that supplies an atmosphere gas including mist and vapor of a developing solution onto a surface of the substrate within the processing vessel; and a first temperature control unit that controls the temperature control plate to a temperature allowing the atmosphere gas to be condensed on the substrate. Here, an inner wall of the processing vessel is maintained at a temperature at which the atmosphere gas is hardly condensed on the inner wall.

By way of example, the developing apparatus may further include a temperature setting unit that sets a temperature of the temperature control plate through the first temperature control unit such that a liquid film of the developing solution on the surface of the substrate is formed in a thickness in accordance with a processing recipe. Further, the developing apparatus may further include a second temperature control unit that maintains the inner wall of the processing vessel at a temperature at which the vapor is hardly condensed on the inner wall. Furthermore, by way of example, the temperature control plate may include an attracting mechanism that attracts the substrate onto a surface of the temperature control plate.

The atmosphere gas may include the vapor of the developing solution without containing the mist of the developing solution. Further, by way of example, the atmosphere gas supply unit may include a heating unit that heats the atmosphere gas. The atmosphere gas may be heated to a temperature higher than a saturation temperature of the developing solution in a heating atmosphere by the heating unit.

In accordance with another aspect of the present disclosure, there is provided a developing method for developing an exposed substrate. The developing method includes loading the substrate into an airtightly sealed processing vessel that forms a processing atmosphere therein; supplying an atmosphere gas including mist and vapor of a developing solution onto a surface of the substrate loaded into the processing vessel; controlling a temperature control plate, which is provided within the processing vessel and mounts the substrate thereon, to a temperature allowing the atmosphere gas to be condensed on the substrate; and condensing the vapor by mounting the substrate on the temperature control plate and forming a liquid film of the developing solution by the mist and the condensed vapor. Here, an inner wall of the processing vessel is maintained at a temperature at which the vapor is hardly condensed on the inner wall.

The developing method may further include setting a temperature of the temperature control plate such that the liquid film of the developing solution on the surface of the substrate is formed in a thickness in accordance with a processing recipe. Further, by way of example, the atmosphere gas may include the vapor of the developing solution without containing the mist of the developing solution. The developing method may further include heating the atmosphere gas by a heating unit. Here, the atmosphere gas may be heated to a temperature higher than a saturation temperature of the developing solution in a heating atmosphere.

In accordance with still another aspect of the present disclosure, there is provided a storage medium that stores therein a program to be used in a developing apparatus that develops an exposed substrate within a processing vessel. The program may include processing steps for implementing the above-mentioned developing method.

In accordance with the present disclosure, the atmosphere gas including the mist and the vapor of the developing solution is supplied onto the substrate, and the temperature of the temperature control plate is set to be equal to or lower than the temperature at which the vapor of the developing solution would be condensed on the substrate. Thus, the usage amount of the developing solution can be reduced, and the liquid film can be rapidly formed on the entire surface of the substrate.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

First Embodiment

Figure 1:
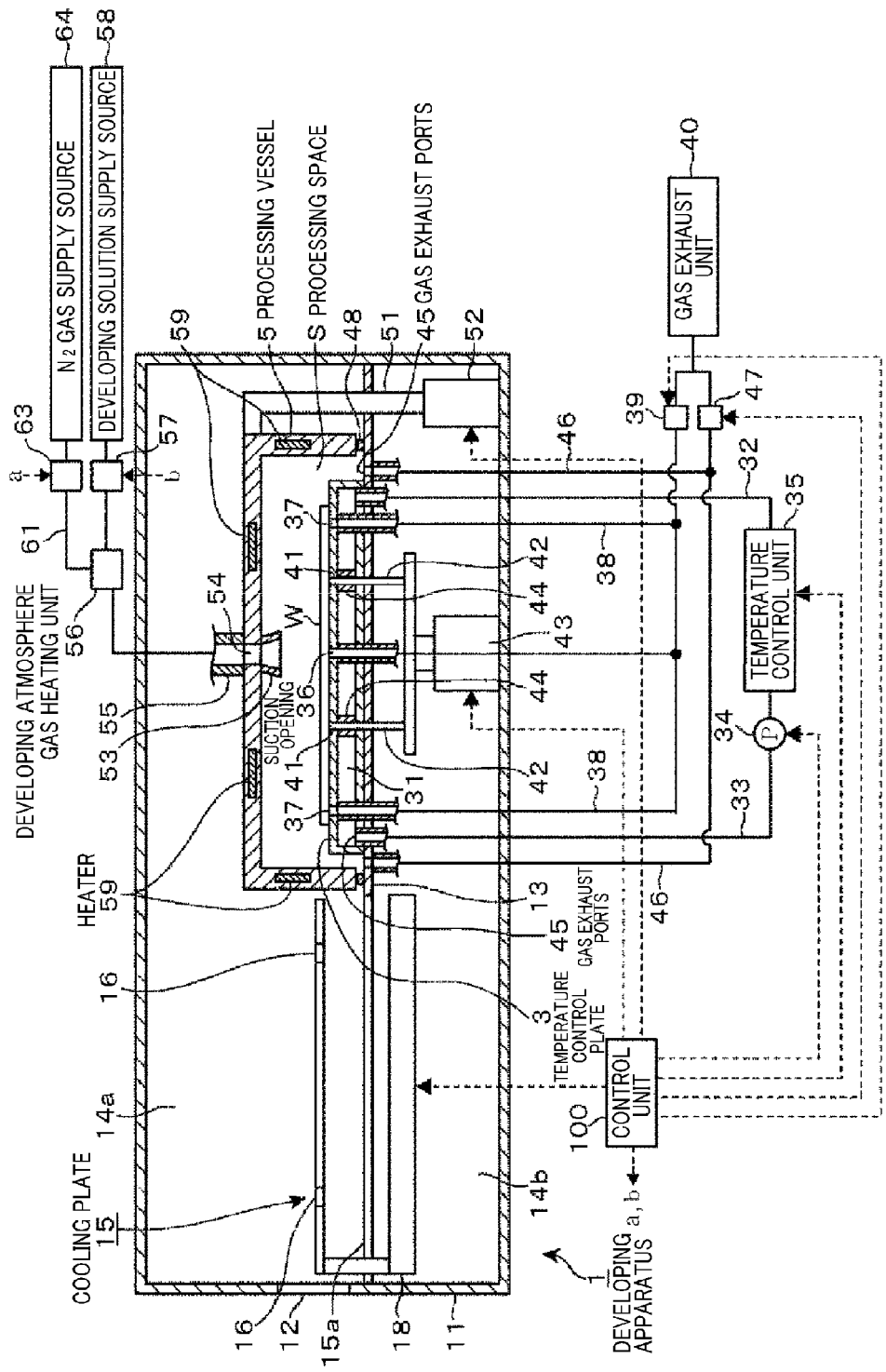
FIG. 1 is a longitudinal cross sectional view of a developing apparatus in accordance with an embodiment of the present disclosure.
Figure 2:
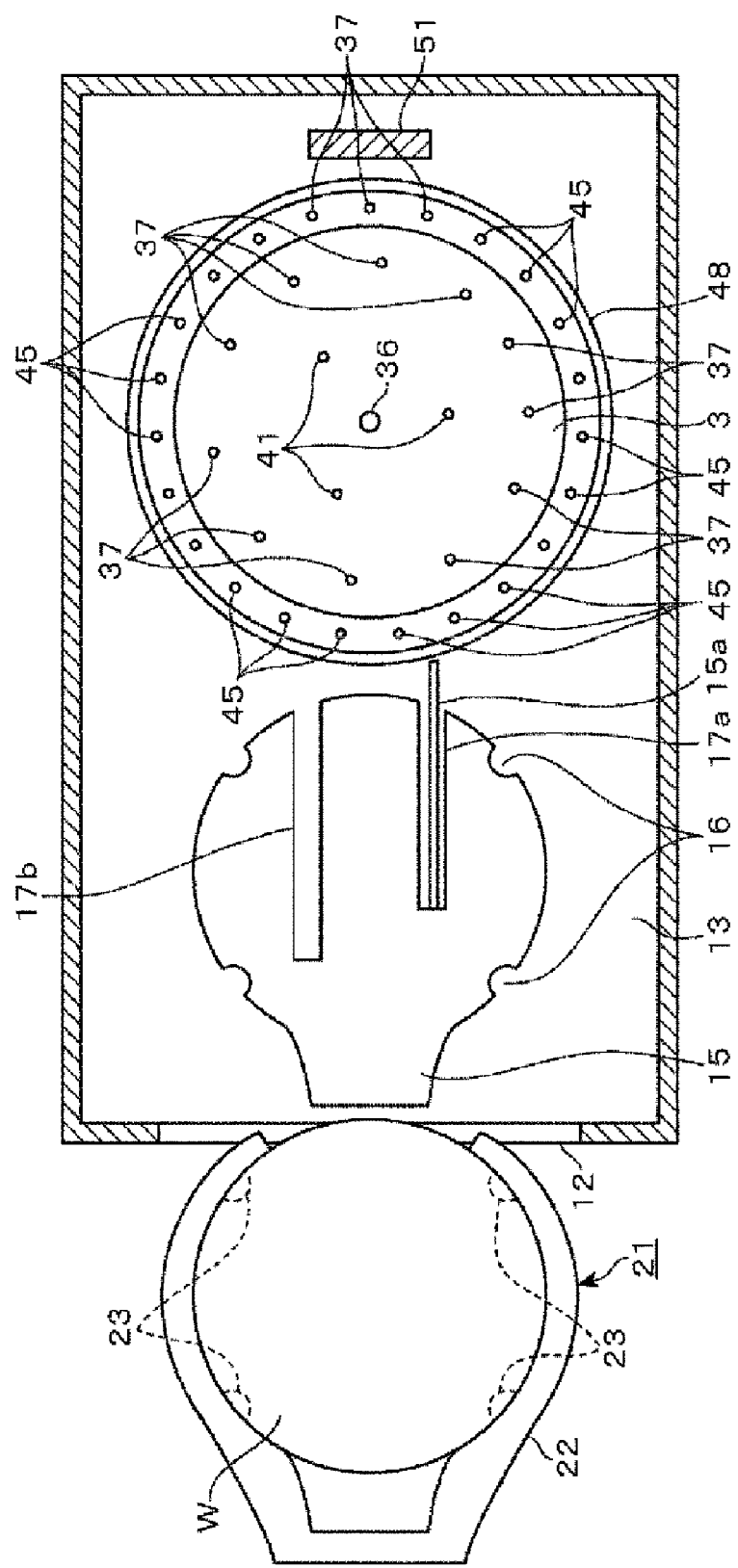
FIG. 2 is a plane view of the developing apparatus.

A developing apparatus 1 in accordance with an embodiment of the present disclosure will be described with reference to FIGS. 1 and 2. FIG. 1 is a longitudinal cross sectional view of the developing apparatus 1, and FIG. 2 is a transversal cross sectional view thereof. The developing apparatus 1 may include a housing 11, and a transfer port 12 for a wafer W is opened in a sidewall of the housing 11. A wafer W is transferred into the housing 11 by a transfer mechanism 21 shown in FIG. 2 through the transfer port 12.

By way of example, a water-repellent resist film is formed on a surface of the wafer W, and the resist film is made of positive resist and is previously exposed to light via a preset pattern by an exposure apparatus. However, the developing apparatus and a developing method in accordance with the present disclosure may also be applied to an organic developing process or a resist film made of negative resist. Here, the organic developing process refers to a developing process of mainly using an organic material as a developing solution. Further, after exposed to light, the wafer W may be subjected to a heating process (post exposure bake: PEB) until the wafer W is transferred into the developing apparatus 1. The transfer mechanism 21 may include an arm 22 configured to surround the circumferential periphery of the wafer W; and a plurality of, e.g., four supports 23 positioned on an inner circumference of the arm 22 so as to support a rear surface of the wafer W.

Provided within the housing 11 is a partition plate 13 that divides the inside of the housing 11 into an upper region and a lower region. The upper region above the partition plate 13 serves as a loading area 14a for loading the wafer W into a processing vessel 5 to be described later. In the loading area 14a, a cooling plate 15 is provided. The cooling plate 15 is formed in a substantially circular shape and is provided with cut-off portions 16 so as not to interfere with the supports 23 of the transfer mechanism 21 when the wafer W is transferred between the transfer mechanism 21 and the cooling plate 15. The cut-off portions 16 are formed from the periphery toward the center of the cooling plate 15. The cooling plate 15 has, in its rear surface, a non-illustrated flow path for flowing therein, e.g., temperature-controlled water. The wafer W, which is previously heated by a heating apparatus before loaded into the developing apparatus 1, is mounted on the cooling plate 15, and the wafer W is cooled.

The cooling plate 15 is provided with slits 17a and 17b, and elevating pins 42 to be described later are protruded from a surface of the cooling plate 15 through the slits 17a and 17b. In a lower area 14b below the partition plate 13, a driving unit 18 connected with the cooling plate 15 is provided so as to move the cooling plate 15 in a horizontal direction along a guide 15a which is extended from a front side toward a rear side of the developing apparatus 1.

Figure 3:
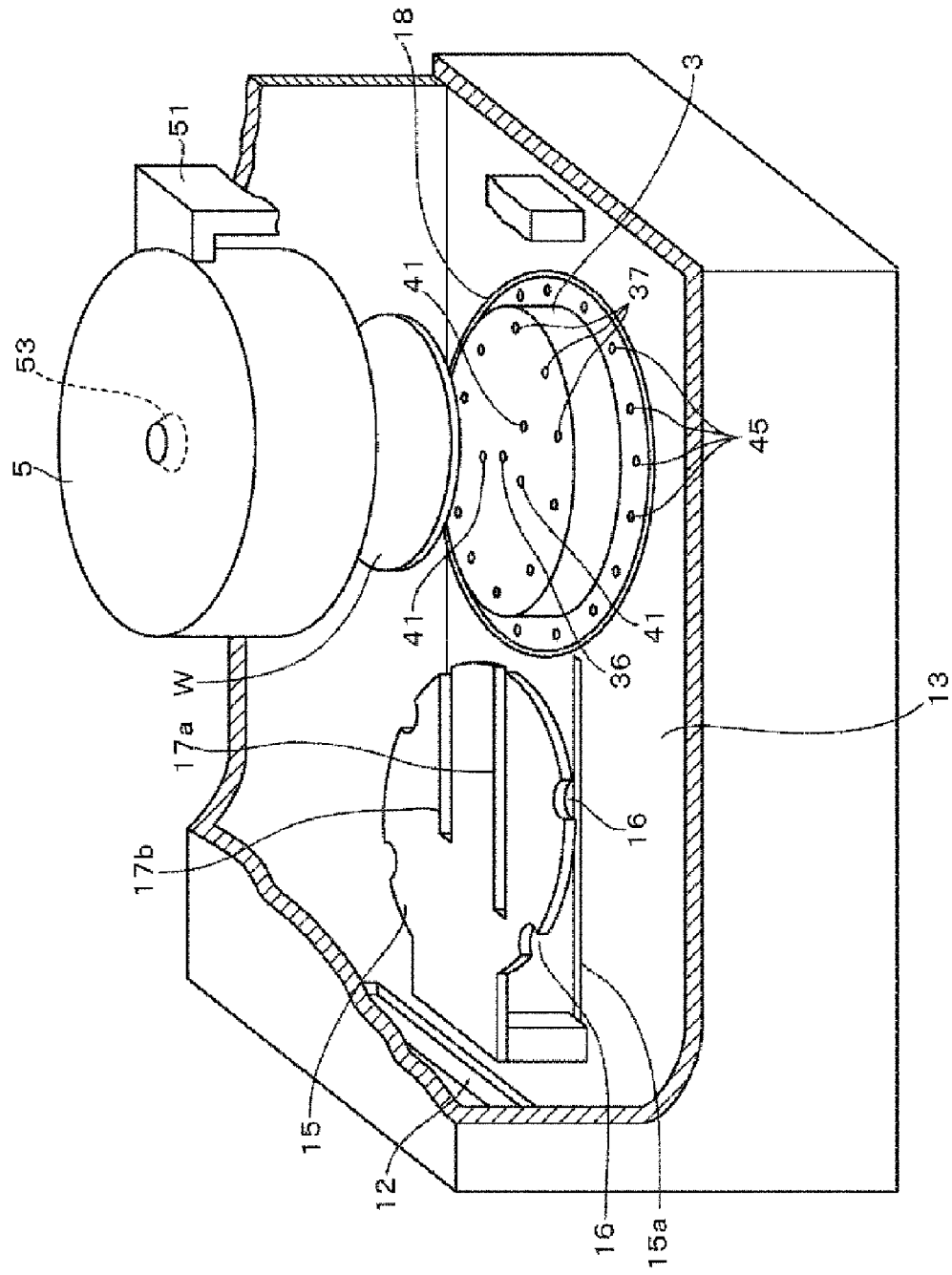
FIG. 3 is a perspective view of the developing apparatus.

FIG. 3 is a perspective view of the developing apparatus 1. As shown in FIG. 3, a circular temperature control plate 3 configured to mount thereon the wafer W is provided in the rear side of the developing apparatus 1. A flow path 31 for a temperature-controlled fluid, e.g., water, is provided within the temperature control plate 3. The temperature control plate 3 is connected with one ends of a temperature-controlled water supply pipe 32 and a temperature-controlled water collection pipe 33, and the other ends of the temperature-controlled water supply pipe 32 and the temperature-controlled water collection pipe 33 are connected with a pump 34. A temperature control unit 35 is provided on the temperature-controlled water supply pipe 32, and the temperature control unit 35 may include a heater for heating water supplied therein and a coolant path for a coolant to cool the water by heat exchange. By controlling an output of the heater and a flow rate of the coolant, the temperature of the wafer may be controlled to a temperature set by a user.

The temperature-controlled water supply pipe 32, the temperature-controlled water collection pipe 33 and the flow path 31 form a circulation path for temperature-controlled water, and the water supplied into the temperature-controlled water supply pipe 32 by the pump 34 is supplied into the flow path 31 after its temperature is controlled by the temperature control unit 35. Then, the water is collected from the flow path 31 through the temperature-controlled water collection pipe 33 by the pump 34 and then is supplied again into the temperature-controlled water supply pipe 32 and the temperature of the temperature-controlled water is controlled. By flowing the temperature-controlled water as stated above, a temperature of an entire surface of the temperature control plate 3 becomes uniform and is controlled to be substantially the same as the temperature of the water adjusted by the temperature control unit 35. Further, the temperature of the wafer W mounted on the temperature control plate 3 is controlled to be substantially the same as the temperature of the surface of the temperature control plate 3.

A suction opening 36 is opened in a central surface of the temperature control plate 3, and a multiple number of suction openings 37 are opened in a peripheral surface of the temperature control plate 3 along the circumference of the temperature control plate 3. One ends of gas exhaust pipes 38 are respectively connected with the suction openings 36 and 37, and the other ends of the gas exhaust pipes 38 are joined together and connected with a gas exhaust unit 40 including a vacuum pump via a flow rate controller 39. The flow rate controller 39 may include a valve and/or a mass flow controller and control a gas exhaust amount. The suction openings 36 and 37, the flow rate controller 39 and the gas exhaust unit 40 serve as an attracting mechanism that attracts the wafer W onto the temperature control plate 3.

Three holes 41 are provided in the surface of the temperature control plate 3 along the circumference of the temperature control plate 3, and the three elevating pins 42 are inserted into the holes 41 in a thickness direction of the temperature control plate 3 (only two elevating pins 42 are shown in FIG. 1 for the simplicity of illustration). The elevating pins 42 are protruded from or retracted into the surface of the temperature control plate 3 by an elevating mechanism 43 and transfers the wafer W between the cooling plate 15 and the temperature control plate 3. Sealing members 44 for preventing leakage of the temperature-controlled water are provided around the elevating pins 42 within the temperature control plate 3.

The partition plate 13 is provided with a multiple number of gas exhaust ports 45 arranged to surround the temperature control plate 3, and one ends of gas exhaust pipes 46 are connected with the gas exhaust ports 45. The other ends of the gas exhaust pipes 46 are joined together and connected with the gas exhaust unit 40 via a flow rate controller 47. The flow rate controller 47 may have the same configuration as that of the flow rate controller 39. Further, an O-ring 48 is provided on the partition plate 13 to surround the gas exhaust ports 45.

The processing vessel 5 is installed above the temperature control plate 3, and the processing vessel 5 is configured as a flat circular vessel having an open bottom. The processing vessel 5 is connected with an elevating mechanism 52 via a support 51 and is moved up and down by the elevating mechanism 52. As depicted in FIG. 1, a bottom end of the processing vessel 5 comes into contact with the O-ring 48 when the processing vessel 5 is lowered, so that an airtightly sealed processing space (processing atmosphere) S is formed. Heaters 59 are installed in a wall of the processing vessel 5, and the heaters 59 maintains an inner wall of the processing vessel 5 at a temperature at which a developing atmosphere gas to be described later hardly condenses. Here, the temperature at which the developing atmosphere gas hardly condenses refers to a temperature at which the developing atmosphere gas does not condense and also refers to a temperature higher than a dew point of developing solution vapor included in the developing atmosphere gas supplied into the processing space S. Provided in a central bottom surface of a ceiling of the processing vessel 5 is a nozzle 53 for supplying the vapor of the developing solution into the processing space S. The nozzle 53 is connected with one end of a developing atmosphere gas supply pipe 55 through an opening 54 provided in a central portion of the ceiling of the processing vessel 5.

The other end of the developing atmosphere gas supply pipe 55 is connected with a developing solution supply source 58 storing therein the developing solution via a developing atmosphere gas heating unit 56 and a flow rate controller 57 in this sequence. The developing solution supply source 58 may include a non-illustrated force-feeding unit and supply the developing solution to the downstream side of the developing atmosphere gas supply pipe 55. The flow rate controller 57 may include a valve and/or a mass flow controller, like the flow rate controllers 39 and 47, and control a supply flow rate of the developing solution to the downstream side. The developing atmosphere gas heating unit 56 may mix the developing solution supplied through the developing atmosphere gas supply pipe 55 and a $N_2$ gas supplied through an inert gas supply pipe 61 to be described later and generate the developing atmosphere gas including mist of the developing solution (hereinafter, referred to as "developing mist"). The generated developing atmosphere gas is supplied into the processing space S via the developing atmosphere gas supply pipe 55.

Further, the developing atmosphere gas heating unit 56 may include a heating device such as a heater and heat the developing atmosphere gas to a preset temperature. In the first embodiment, the temperature of the developing atmosphere gas is controlled such that the developing atmosphere gas can contain the developing mist and the vapor of the developing solution (hereinafter, referred to as "developing vapor"). As will be described later, in order to adjust a condensation amount on the wafer W by controlling the temperature of the temperature control plate 3, a flow rate of the developing solution supplied into the developing atmosphere gas heating unit 56 by the flow rate controller 57 during a developing process, an amount (g/cm$^3$) of the developing solution included in the developing vapor and the temperature of the developing atmosphere gas may be regulated constant in processing each wafer W. Further, a supply time of the developing atmosphere gas into the processing space S and a gas exhaust amount from the gas exhaust ports 45 and the suction openings 36 and 37 may also be regulated constant for the each wafer W. Accordingly, a constant amount of developing mist may adhere to each wafer W. The developing atmosphere gas supply pipe 55 and the developing atmosphere gas heating unit 56 serve as an atmosphere gas supply unit.

One end of the inert gas supply pipe 61 is connected with the developing atmosphere gas heating unit 56, and the other end of the inert gas supply pipe 61 is connected with a $N_2$ gas supply source 64 storing therein an inert gas such as a $N_2$ gas. The $N_2$ gas may be supplied into the processing space S while being included in the developing atmosphere gas as stated above, or the $N_2$ gas may be independently supplied into the processing space S as a purge gas through the developing atmosphere gas supply pipe 55.

Figure 4:
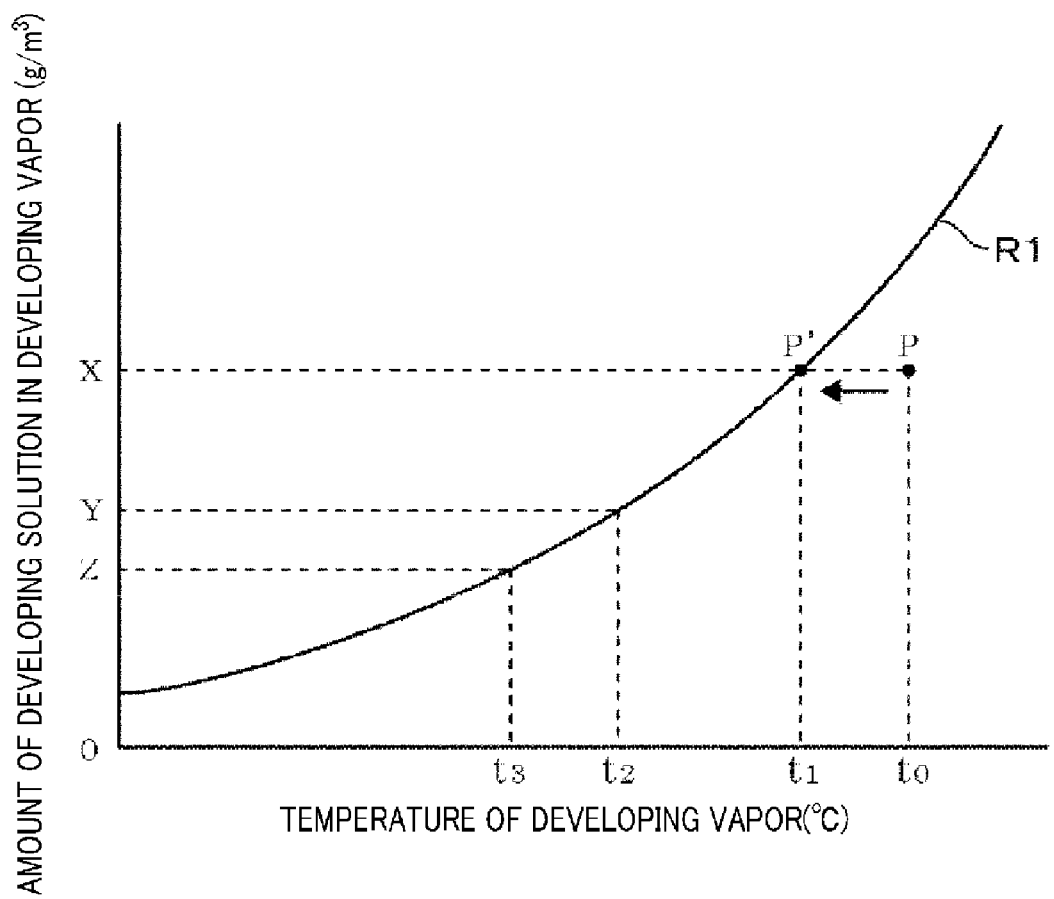
FIG. 4 is a graph showing a vapor pressure curve of a developing solution.

Here, a developing process performed by the developing apparatus 1 in accordance with the first embodiment will be schematically described. FIG. 4 is a graph showing a vapor pressure curve R1 of a developing solution. A horizontal axis of the graph indicates a temperature of developing vapor, and a vertical axis of the graph indicates an amount ($g/cm^3$) of the developing solution included in the developing vapor. By way of example, it is assumed that the developing vapor in a developing atmosphere gas, which is generated by the developing atmosphere gas heating unit 56 and is supplied into the processing space S, is in a state indicated by a point P on the graph. That is, a temperature of the developing vapor is $t_0$, and the developing vapor includes the developing solution in an amount of X $g/cm^3$.

Figure 5C:
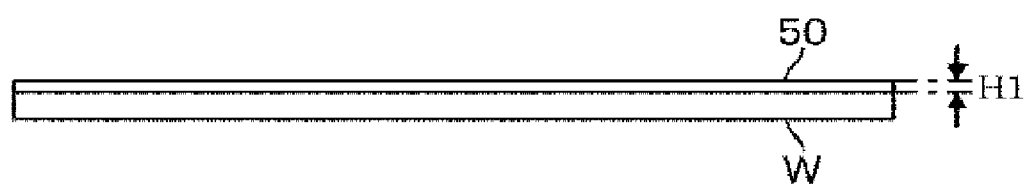
FIGS. 5A to 5C are diagrams for illustrating condensation of a developing solution on a wafer.
Figure 5A:
Figure 5B:

FIG. 5A illustrates a wafer W before the developing process is performed. If the developing vapor is supplied into the processing space S and the wafer W is mounted on the temperature control plate 3, a temperature of the wafer W may be decreased depending on a temperature of the temperature control plate 3. Accordingly, as indicated by a point P' on the graph, the temperature of the developing vapor around the wafer W may be decreased from $t_0$ to a dew point $t_1$. The dew point $t_1$ is a maximum temperature at which the developing vapor becomes saturated vapor. That is, the developing vapor may not be condensed at a temperature higher than the dew point $t_1$, whereas the developing vapor may be condensed at a temperature equal to or lower than the dew point $t_1$. If the temperature of the developing vapor reaches the dew point $t_1$ as mentioned above, the developing solution included in the developing vapor may be condensed on a surface of the wafer W, so that a very thin developing solution film 50 may be formed, as illustrated in FIG. 5B. If the temperature of the developing vapor is further decreased below the dew point $t_1$, the condensation amount of the developing solution may be increased, so that a film thickness H1 of the developing solution film 50 may also be increased, as shown in FIG. 5C.

If the temperature of the developing vapor is decreased to, e.g., $t_2$ on the graph, the developing solution in an amount corresponding to a difference between a saturation amount X of the developing solution at the dew point $t_1$ and a saturation amount Y of the developing solution at the temperature $t_2$ may be condensed on the surface of the wafer W. Likewise, if the temperature of the developing vapor is decreased to $t_3$, the developing solution in an amount corresponding to a difference between the saturation amount X of the developing solution and a saturation amount Z of the developing solution at the temperature $t_3$ may be condensed on the surface of the wafer W. In this way, the thickness H1 of the developing solution film 50 may vary depending on the amount of the developing solution condensed on the surface of the wafer W. Accordingly, by controlling the temperature of the temperature control plate 3, the condensation amount can be controlled, and, thus, the thickness H1 of the developing solution film 50 can also be controlled.

As discussed above, since a certain amount of developing mist already adheres to the surface of the wafer W, the actual thickness H1 of the developing solution film formed on the wafer W may become a sum of a condensation amount of the developing solution included in the developing vapor and an adhesion amount of the developing mist. In the developing apparatus 1, a corresponding relationship between the temperature of the wafer W and the thickness H1 of the developing solution film 50 is previously stored in a memory of a control unit 100 to be described later. Therefore, if a user determines the film thickness H1, the temperature control unit 35 is operated to control the temperature of the temperature control plate 3 based on the corresponding relationship.

After the developing solution film 50 is formed, the liquid component of the developing solution film 50 is removed in the developing apparatus 1, and the surface of the wafer W gets dry and a reaction between the resist and the developing solution is stopped. Desirably, the developing solution film 50 may have a smaller thickness to dry the wafer W. Unless a failure or a defect in the developing process occurs when forming a resist pattern, the film thickness H1 may be set to be small. In consideration of these cases, the user may determine the film thickness H1. By way of example, the film thickness H1 of FIG. 5C may be in the range of about 1 μm to about 100 μm.

The control unit 100 of the developing apparatus 1 will now be explained. The control unit 100 may be composed of, e.g., a computer and include a non-illustrated program storage unit. Stored in the program storage unit is a program, e.g., software, including commands for implementing the developing process to be described. The control unit 100 reads out the program and sends a control signal to each component of the developing apparatus 1. Accordingly, the elevation of the processing vessel 5 and the elevating pins 42, the temperature control of temperature-controlled water by the temperature control unit 35, the supply of the temperature-controlled water into the flow path 31 of the temperature control plate 3, the output of the heaters 59 of the processing vessel 5, the supply of the developing atmosphere gas into the processing space S may be controlled. The program may be stored in the program storage unit by being stored in a storage medium such as a hard disk, a compact disk, a magnet optical disk or a memory card.

Figure 6:
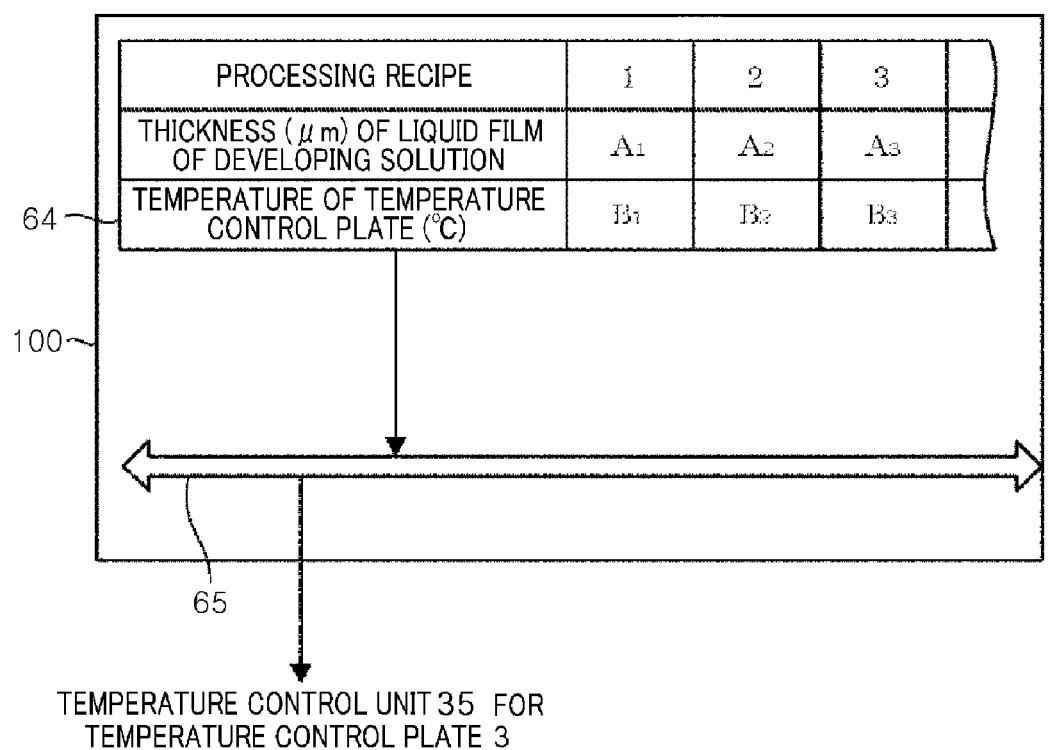
FIG. 6 is an example table for describing a relationship between a temperature of a stage and a thickness of a liquid film of a developing solution and the table is stored in a memory of a control unit.

Further, a table 64 as shown in FIG. 6 is also stored in the memory of the control unit 100. In the figure, a reference numeral 65 denotes a bus. Stored in the table 64 is a corresponding relationship between the temperature of the temperature control plate 3 and the film thickness H1 when the wafer W is mounted, for every processing recipe number. The temperature of the temperature control plate 3 may be the same as the temperature of the wafer W mounted on the temperature control plate 3 as stated above. The control unit 100 may include a display unit composed of, e.g., a display, and the corresponding relationship is displayed on the display unit. The user may determine the temperature of the temperature control plate 3 and the thickness H1 of the developing solution film 50 by selecting a processing recipe number through, e.g., a non-illustrated input unit with reference to the corresponding relationship displayed on the display unit.

Now, an operation of the developing apparatus 1 will be discussed. First, a user determines a temperature of the temperature control plate 3 and a thickness H1 of the developing solution film 50 by selecting a processing recipe number through the non-illustrated input unit. Then, temperature-controlled water at a temperature according to a processing recipe selected by the user is supplied into the temperature control plate 3, so that the surface of the temperature control plate 3 is controlled to a preset temperature, e.g., about 20° C. Further, evacuation in a certain gas exhaust amount is performed through the gas exhaust ports 45 and the suction openings 36 and 37, and temperature of the inner wall of the processing vessel 5 is controlled by the heaters 59 to a temperature the same as, e.g., a temperature of a developing atmosphere gas supplied onto the wafer W.

Figure 7A:
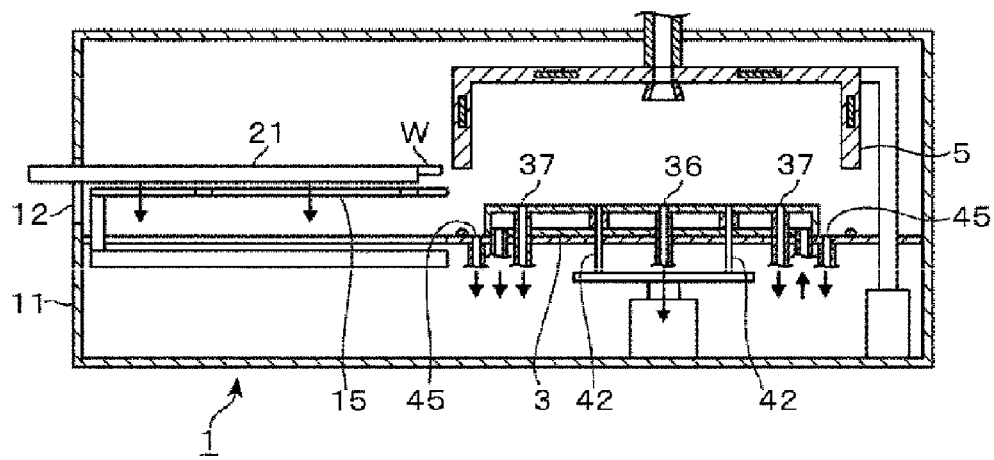
FIGS. 7A to 7C are process diagrams for illustrating a process sequence performed by the developing apparatus.
Figure 7B:
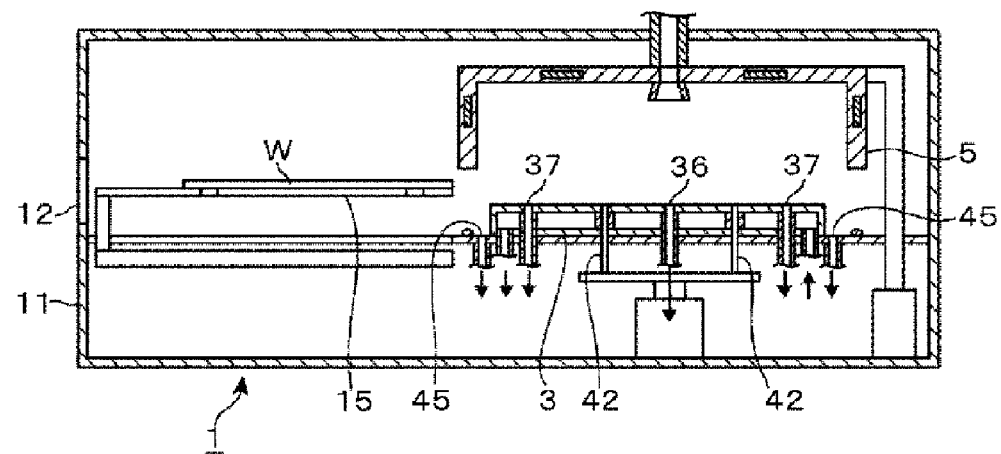

Subsequently, the transfer mechanism 21 is loaded into the housing 11 through the transfer port 12 while holding thereon a wafer W which is previously heated by the heating apparatus (FIG. 7A). Then, the transfer mechanism 21 is retreated out of the housing 11 after it transfers the wafer W onto the cooling plate 15 (FIG. 7B). The cooling plate 15 is moved forward to above the temperature control plate 3 while cooling the wafer W. A temperature of the wafer W cooled by the cooling plate 15 may be controlled to be higher than a dew point of developing vapor supplied into the processing vessel 5, i.e., to be about 50° C.

Figure 7C:
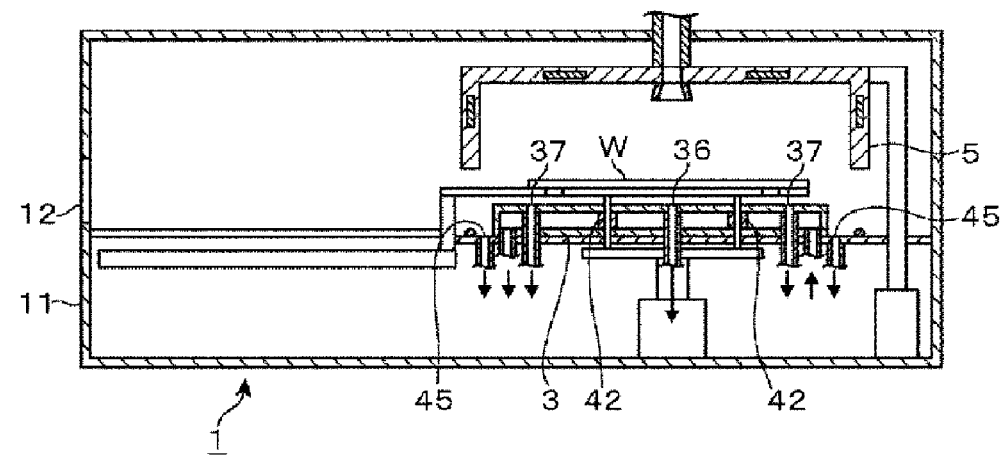
Figure 8A:
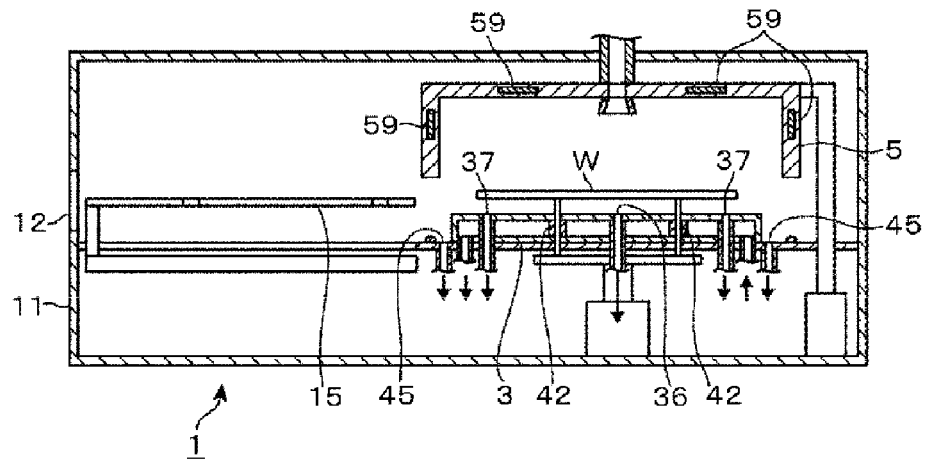
FIGS. 8A to 8C are process diagrams for illustrating a process sequence performed by the developing apparatus.
Figure 8B:
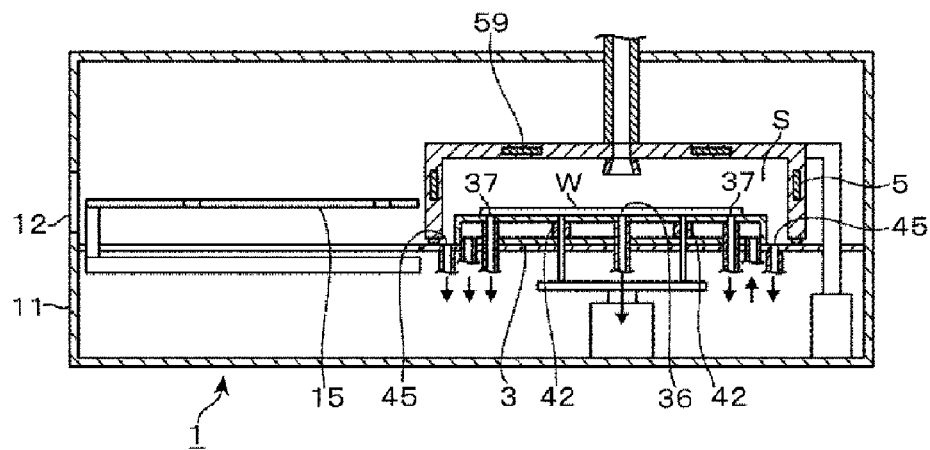

If the wafer W is transferred to above the temperature control plate 3 by the cooling plate 15, the elevating pins 42 are raised to hold the wafer W thereon (FIG. 7C). Then, the cooling plate 15 is retreated to the transfer port 12 (FIG. 8A), and the elevating pins 42 are lowered and the wafer W is mounted on the temperature control plate 3. A central portion and a peripheral portion of the wafer W are suctioned by the suction openings 36 and 37, so that the entire rear surface of the wafer W firmly adheres to the surface of the temperature control plate 3. The temperature of the entire wafer W is controlled to be substantially the same as the surface temperature of the temperature control plate 3, and the processing vessel 5 is lowered to thereby form the processing space S (FIG. 8B).

Figure 8C:
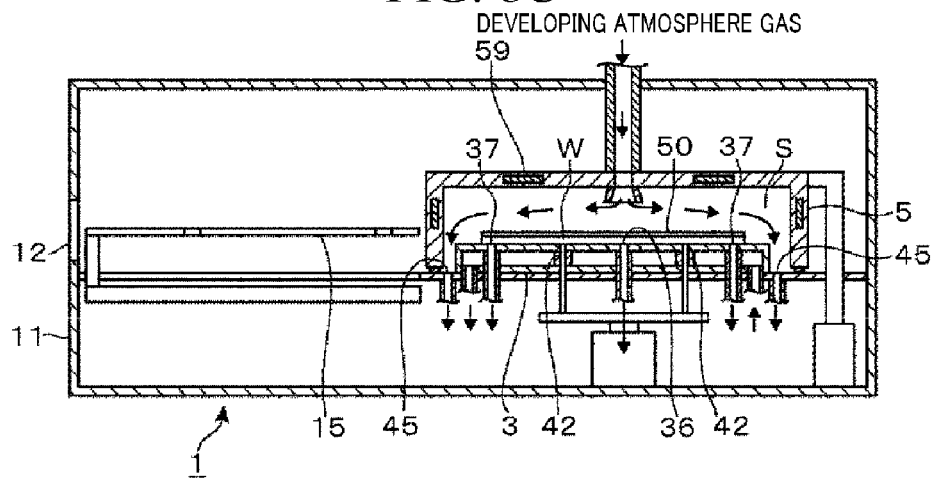
Figure 9A:
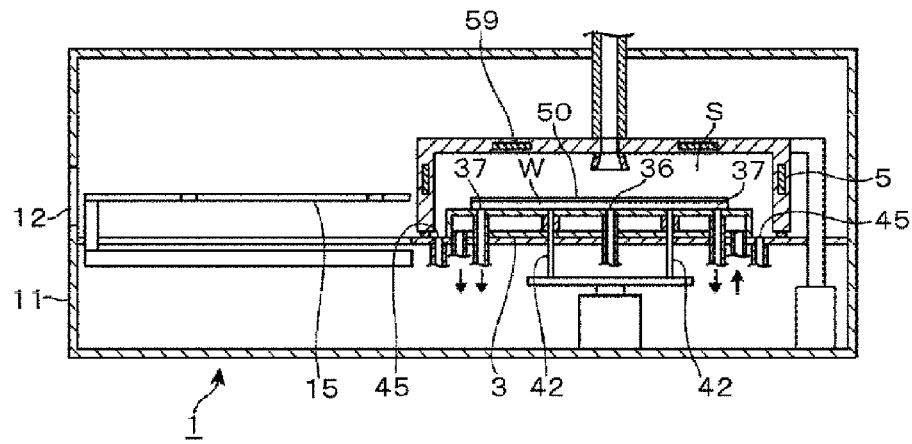
FIGS. 9A to 9C are process diagrams for illustrating a process sequence performed by the developing apparatus.

A developing atmosphere gas including developing mist and developing vapor is generated by the developing atmosphere gas heating unit 56 and is supplied into the processing space S. The developing mist in the developing atmosphere gas may adhere to the wafer W, and the developing solution included in the developing vapor may be cooled and condensed on the surface of the wafer W. As a result, a developing solution film 50 may be formed on the surface of the wafer W. If a thickness H1 of the developing solution film 50 reaches the film thickness set by the user (FIG. 8C), the supply of the developing atmosphere gas and the evacuation through the gas exhaust ports 45 are stopped, and a reaction between the developing solution film 50 and resist may progress (FIG. 9A).

Figure 9B:
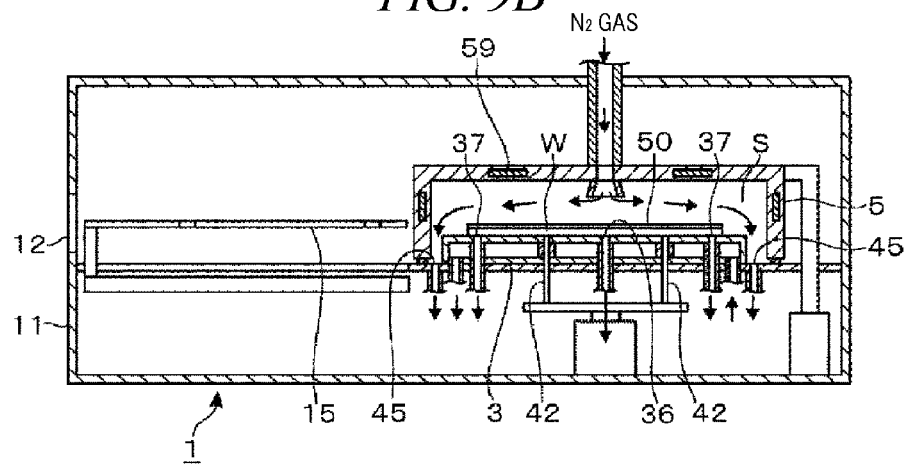
Figure 9C:
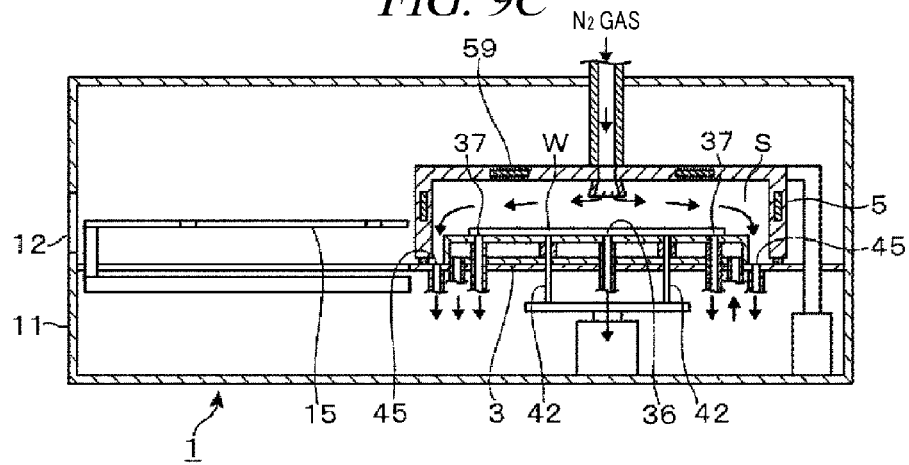
Figure 10A:
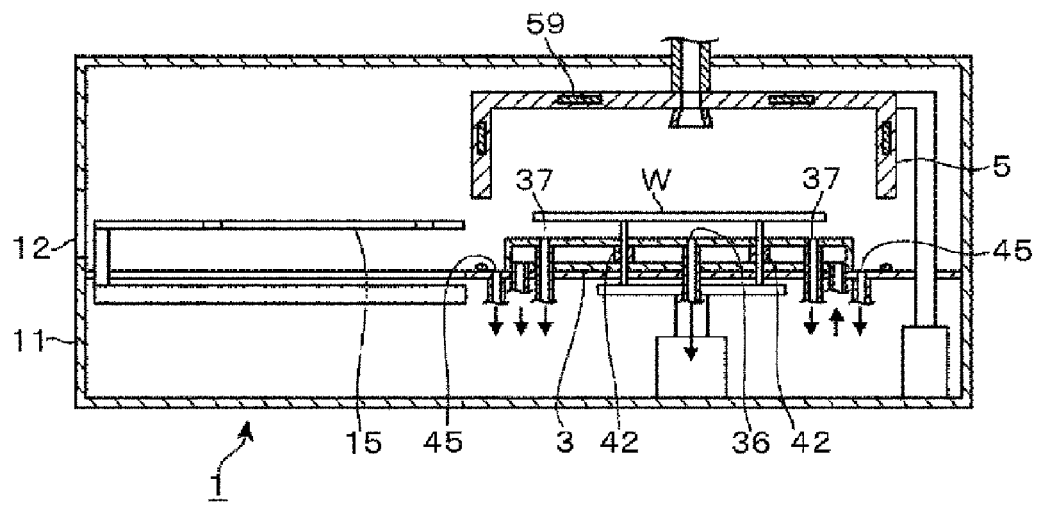
FIGS. 10A and 10B are process diagrams for illustrating a process sequence performed by the developing apparatus.

With a lapse of a preset time after the beginning of the supply of the developing atmosphere gas into the processing space S, the evacuation through the gas exhaust ports 45 is resumed and a N$_2$ gas is supplied into the processing space S (FIG. 9B). Accordingly, the developing atmosphere gas within the processing space S is purged and removed, and the surface of the wafer W is dried by the N$_2$ gas (FIG. 9C). After the wafer W is dried, the supply of the N$_2$ gas is stopped, and the wafer W is raised apart from the temperature control plate 3 by the elevating pins 42. Further, the processing vessel 5 is raised, and, thus, the processing space S is opened to an external atmosphere (FIG. 10A).

Figure 10B:
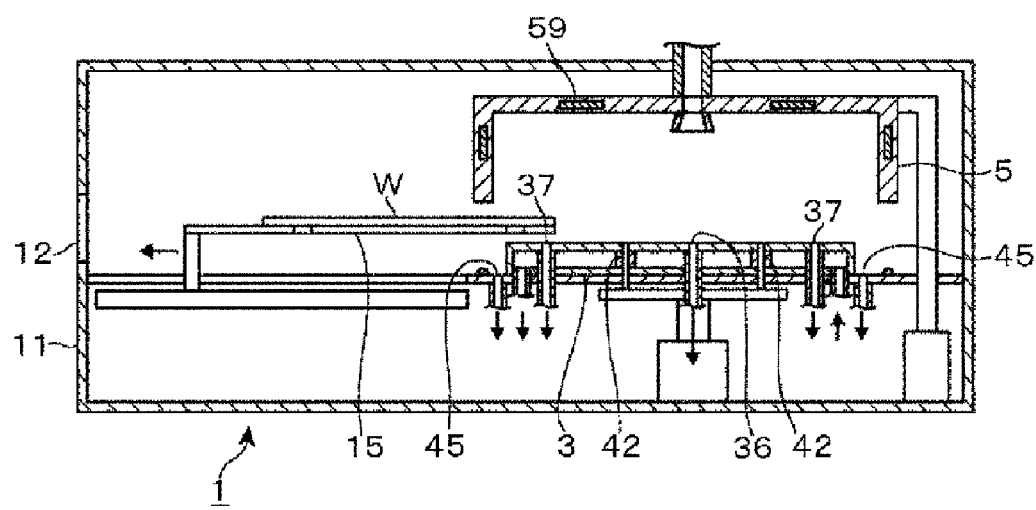

Thereafter, the cooling plate 15 is moved to above the temperature control plate 3, and the wafer W is mounted on the cooling plate 15, and, then, the cooling plate 15 is moved to the transfer port 12 (FIG. 10B). Then, the transfer mechanism 21 receives the wafer W in the reverse order to the order in which the wafer W is transferred onto the cooling plate 15, and the wafer W is taken out of the developing apparatus 1.

Thereafter, the wafer W is transferred into a non-illustrated cleaning apparatus, and a cleaning solution is supplied onto the surface of the wafer W. Accordingly, reformed portions of a resist film as a result of the reaction between the resist and the developing solution may be washed away, and a desired resist pattern may be obtained.

In the developing apparatus 1 in accordance with the first embodiment as described above, the developing solution film 50 is formed through the steps of allowing the developing mist to adhere to the wafer W, cooling the wafer W by the temperature control plate 3; and condensing the developing vapor included in the developing atmosphere gas on the surface of the wafer W. Accordingly, as compared to a case of supplying a developing solution onto the surface of the wafer W through a nozzle, the developing solution film can be rapidly formed on the entire surface of the wafer W, resulting in improvement of throughput. Furthermore, in this developing apparatus 1, since it is not required to supply a great amount of developing solution onto the wafer W to form the developing solution film, a usage amount of the developing solution can be saved, and, thus, processing cost can be reduced. Moreover, in the developing apparatus 1, since the developing solution film 50 can be formed on each portion on the entire surface of the wafer W at the same time, a time period during which the wafer W is in contact with the developing solution film 50 can be made uniform over the entire surface of the wafer W. Thus, uniformity of patterns can be improved over the entire surface of the wafer W.

Further, in the developing apparatus 1, since the central portion and the peripheral portion of the wafer W are suctioned by the suction openings 36 and 37 when the wafer W is mounted on the temperature control plate 3, the entire wafer W can be still allowed to firmly adhere to the temperature control plate 3 even in case the wafer W is bent. Accordingly, the temperature of the entire surface of the wafer W can be controlled uniformly, so that a resist pattern featuring higher uniformity can be formed effectively.

Second Embodiment

Figure 11:
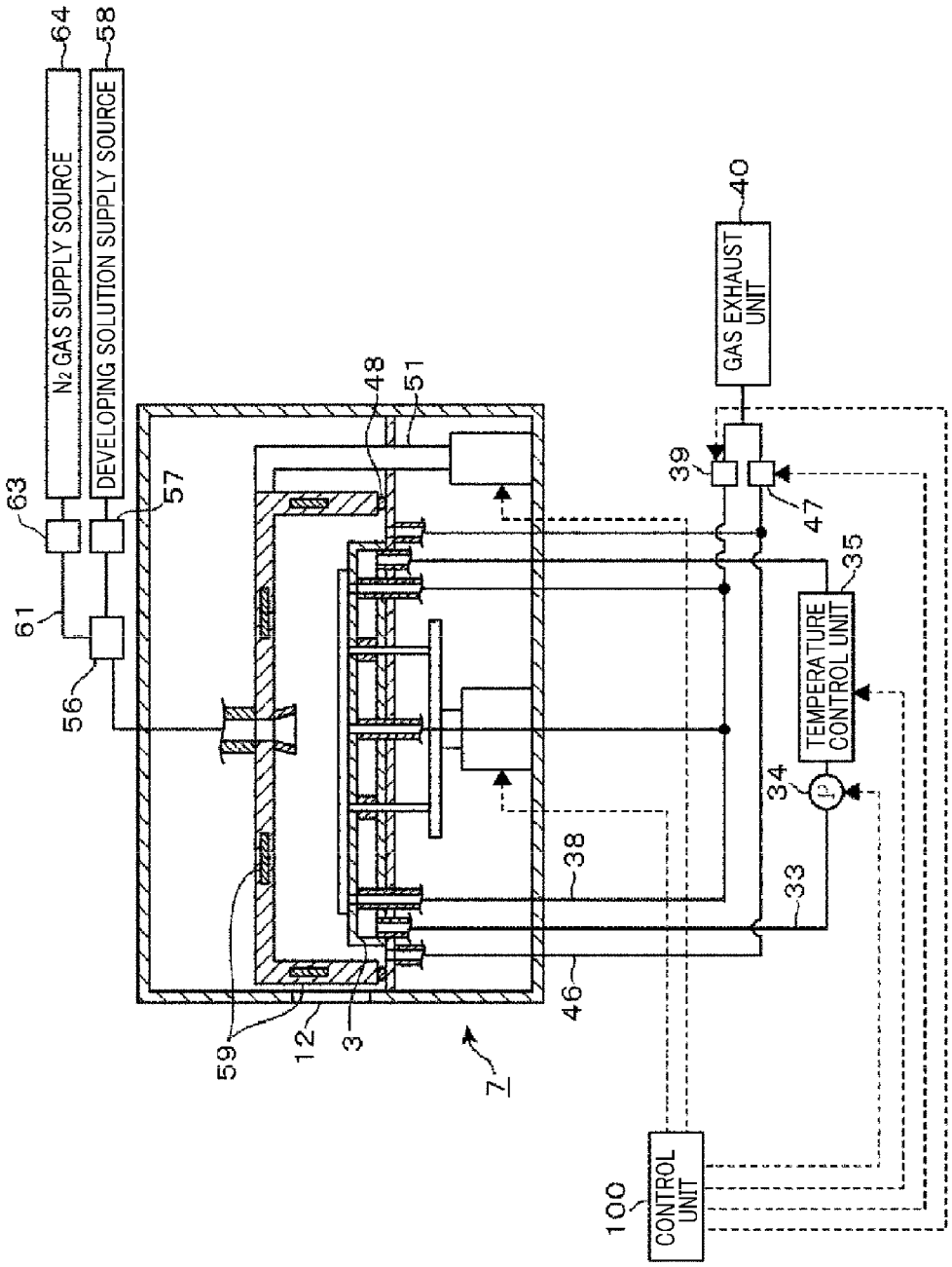
FIG. 11 is a longitudinal cross sectional view of another developing apparatus.
Figure 12A:
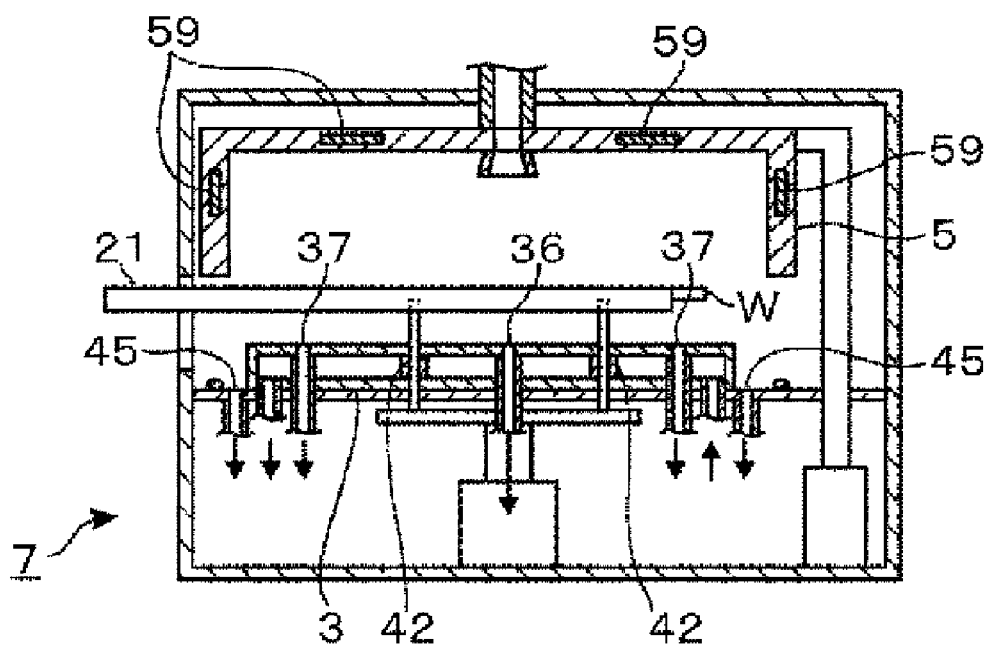
FIGS. 12A and 12B are process diagrams for illustrating a process sequence performed by the developing apparatus.

A developing apparatus 7 in accordance with a second embodiment is illustrated in FIG. 11. The developing apparatus 7 is different from the developing apparatus 1 in that it does not have a cooling plate 15. A process sequence of the developing apparatus 7 may be the same as that of the developing apparatus 1 excepting that a transfer by the cooling plate 15 is not performed in the developing apparatus 7. Referring to FIG. 12, the process sequence of the developing apparatus 7 will be briefly explained. First, a wafer W is directly transferred onto elevating pins 42 from a transfer mechanism 21 (FIG. 12A). Then, as in the first embodiment, the elevating pins 42 are lowered and a processing vessel 5 is lowered, so that a processing space S is formed, and the wafer W is mounted on a temperature control plate 3.

Figure 12B:
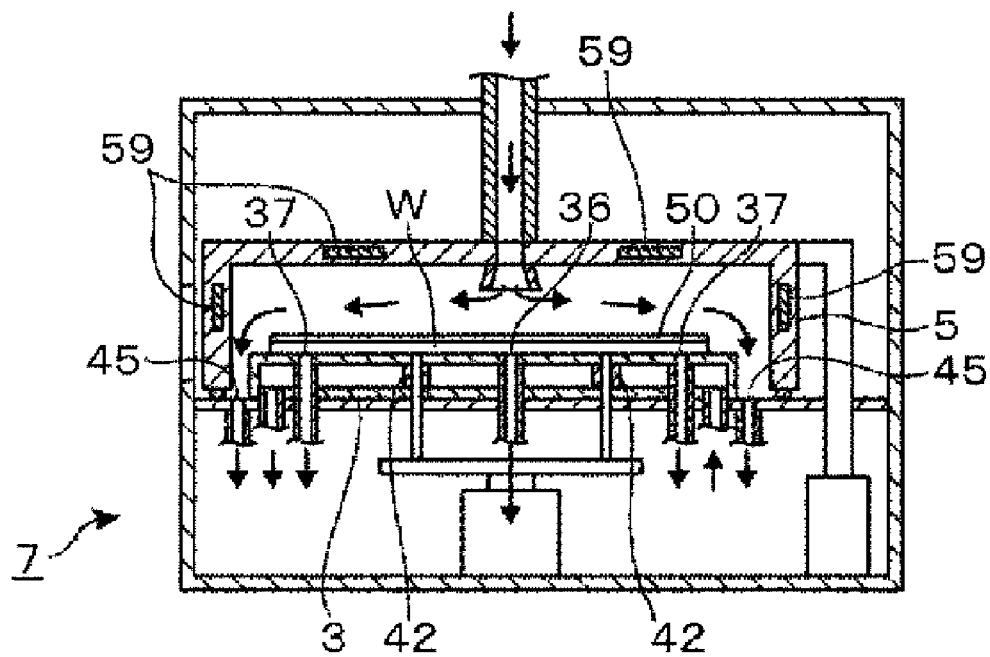

Subsequently, a developing atmosphere gas is supplied, and, thus, a developing solution film 50 is formed (FIG. 12B). With a lapse of a preset time after the wafer W is mounted on the temperature control plate 3, a N$_2$ gas is supplied, and a surface of the wafer W is dried by the N$_2$ gas. Thereafter, the processing vessel 5 is raised, and the wafer W is transferred from the elevating pins 42 onto the transfer mechanism 21.

In the above-described embodiments, a maximum particle diameter of the developing mist may be equal to or less than, e.g., about 50 μm, and an average particle diameter may be equal to or less than, e.g., about 10 μm. By controlling the particle diameter of the developing mist in this way, the developing mist may be in the form of dry fog. Thus, when a developing process is performed, other places than the wafer W can be prevented from being wet by the developing solution. Accordingly, defect in a developing process or particle generation can be suppressed. Further, the method for generating the developing atmosphere gas may not be limited to heating the developing solution. For example, an ultrasonic wave may be applied to the developing solution.

In the developing atmosphere gas heating unit 56, the developing mist may be evaporated by heating the developing atmosphere gas at a temperature higher than a saturation temperature of the developing solution, e.g., about 50° C., and the developing atmosphere gas without containing the developing mist may be supplied into the processing space S. In such a case, the developing solution film 50 may be formed by condensation of the developing vapor included in the developing atmosphere gas, and the user may form the developing solution film 50 of a desired thickness H1 by controlling a condensation amount of the developing vapor, as in the first embodiment, for example. Below, a process sequence for the case of supplying such a developing atmosphere gas without containing developing mist will be explained, while focusing on differences from the above-described first embodiment.

Figure 13A:
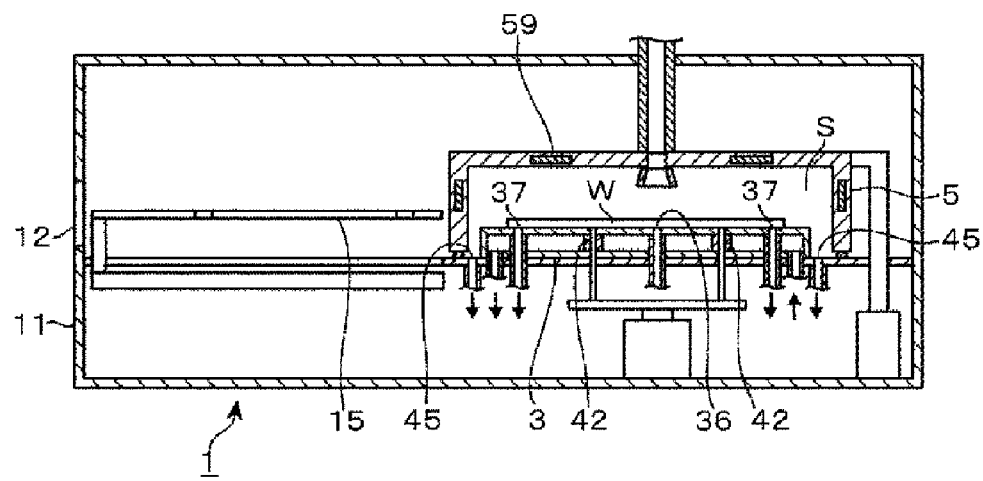
FIGS. 13A and 13B are process diagrams for illustrating another process sequence.
Figure 13B:
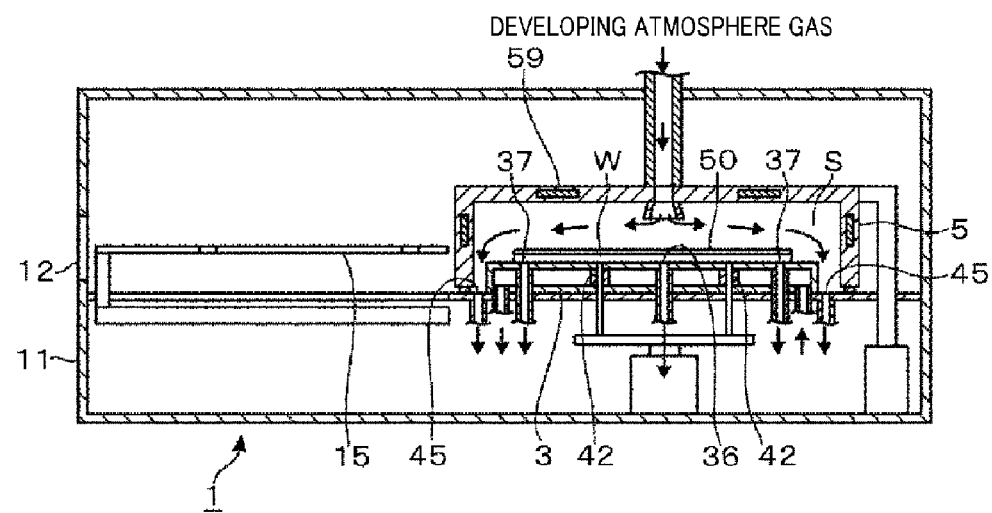

A wafer W is mounted on the temperature control plate 3 and is controlled to a temperature equal to or less than a dew point of developing vapor included in a developing atmosphere gas, and the processing space S is formed (FIG. 13A). The developing atmosphere gas is supplied into the processing space S, and the developing vapor is condensed on a surface of the wafer W (FIG. 13B). If a developing solution film 50 is formed in a thickness in accordance with a processing recipe selected by the user, the supply of the developing vapor and evacuation through the gas exhaust ports 45 are stopped. Thereafter, as in the first embodiment, by supplying a $N_2$ gas, the developing atmosphere gas within the processing space S is removed and the wafer W is dried.

As stated above, even in case of supplying the developing atmosphere gas without containing the developing mist onto the wafer W, the same effects as obtained in the first embodiment can be still achieved. In case of supplying the developing atmosphere gas, it may be possible to hold the wafer W by the elevating pins 42 apart from the temperature control plate 3 when the processing space S is formed, and it may be possible to mount the wafer W on the temperature control plate 3 after the developing atmosphere gas is supplied into the processing space S and then to cool the wafer W, to thereby form the developing solution film 50. Further, when a process using such a developing atmosphere gas is performed, it may be also possible to raise the wafer W apart from the temperature control plate 3 by, e.g., the elevating pins 42 and to dry the wafer W by heat of the developing vapor remaining in the processing space S, and to stop the developing process.

When drying the wafer W after the developing solution film 50 is formed on the wafer W as in the above-mentioned embodiments, with a lapse of a preset time after the wafer W is mounted on the temperature control plate 3, the processing vessel 5 may be raised while the wafer W is still held on the temperature control plate 3. As the processing space S is opened, an exterior air flows to the vicinity of the wafer W. As a result, a partial pressure of the developing vapor around the wafer W may be decreased, which in turn may cause a decrease in a vapor pressure of the developing solution film 50. Consequently, the liquid component of the developing solution film 50 may be evaporated, rendering the surface of the wafer W in a dry state. When the wafer W is in such a dry state, it means that the liquid component of the developing solution has been removed, and other components of the developing solution may still adhere to the wafer W. It has been proved through evaluation tests to be described below that the reaction between the developing solution and the resist is stopped if the liquid component is removed.

In the above-described embodiments, particle generation due to the adhesion of the developing solution to the processing vessel 5 can be securely prevented by installing the heaters 59 in the processing vessel 5. However, the heaters 59 may be omitted. Instead, by way of example, a $N_2$ gas heated by the developing atmosphere gas heating unit 56 may be independently supplied into the processing space S to heat the inner wall of the processing vessel 5. Accordingly, a temperature of the inner wall may be controlled to be higher than a condensation temperature of the developing vapor, and the developing atmosphere gas may be supplied thereafter.

Figure 14:
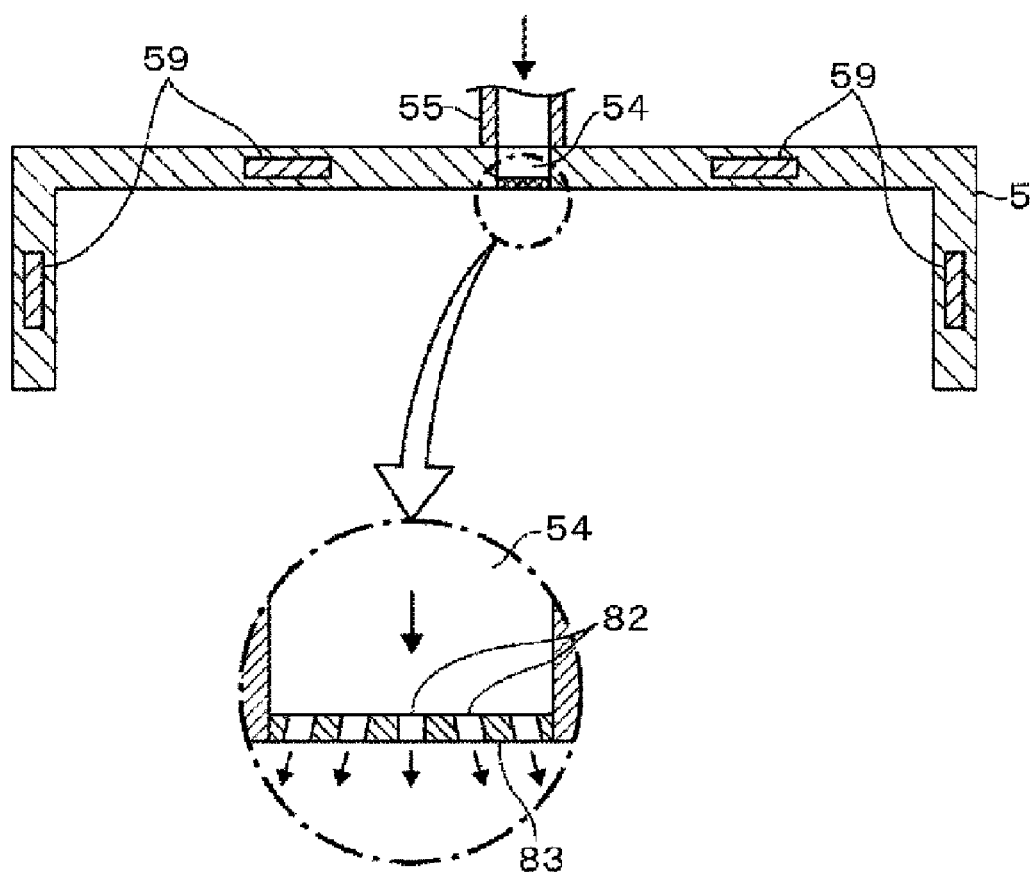
FIG. 14 is a diagram illustrating another configuration of a processing vessel of the developing apparatus.

In the above-described embodiments, although the nozzle 53 is used to supply the developing vapor and the developing mist into the processing space S, the present disclosure may not be limited to using the nozzle. By way of example, as illustrated in FIG. 14, a plate 83 provided with a multiple number of holes 82 may be provided in the opening 54, and the developing atmosphere gas may be supplied into the processing space S through the holes 82.

(Evaluation Tests)
(Evaluation Test 1)

A developing solution was supplied through a nozzle onto wafers W1 to W3 on which resist is coated and which is exposed to light via a preset pattern. For the wafer W1, an image of a cross section of the resist was captured after the developing solution is supplied. For the wafer W2, an image of a cross section of the resist was captured after the developing solution was supplied and then a cleaning solution was supplied for about 2 seconds. For the wafer W3, an image of a cross section of the resist was captured after the developing solution was supplied and then the cleaning solution was supplied for about 13 seconds. Further, the same experiment was conducted while varying the kind of the resist coated on the wafers W1 to W3.

Figure 15A:
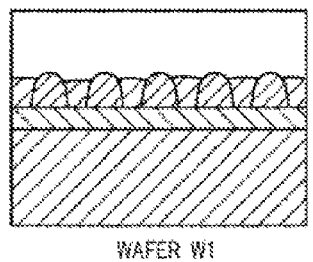
FIGS. 15A to 15F are longitudinal cross sectional views of wafers obtained in an evaluation test.
Figure 15B:
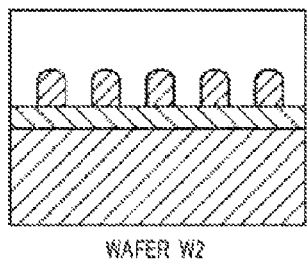
Figure 15C:
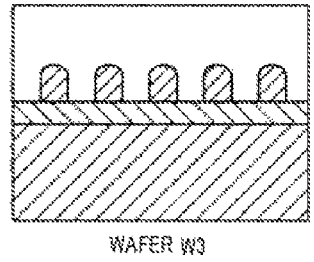
Figure 15D:
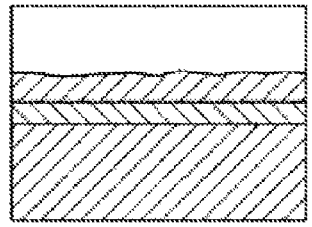
Figure 15E:
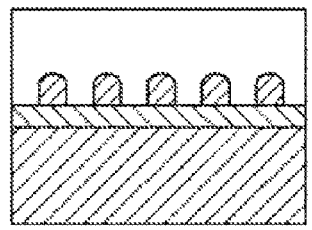
Figure 15F:
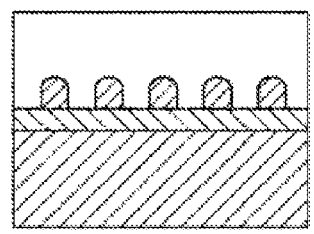

FIGS. 15A to 15F provide results of the evaluation test 1. FIGS. 15A to 15C show images of the wafers W1 to W3 using the same kind of resist, and FIG. 15D to 15F show images of the wafers W1 to W3 using another same kind of resist. Regardless of the kinds of the resist, patterns were not developed on the wafer W1 on which the cleaning solution was not supplied, whereas patterns were developed on the wafers W2 and W3 on which the cleaning solution was supplied.

As can be seen from the result of this experiment, the exposed resist starts to be dissolved in the step that the cleaning solution is supplied, not in the step that the developing solution is supplied. That is, the result shows that it is not by the developing solution that dissolved resist residues are removed. Accordingly, when a developing process is performed, it is deemed to be enough to supply a small amount of developing solution onto the resist. Through this experiment, the present inventors have reached the idea of forming the thin film of the developing solution by condensing the developing solution included in the developing vapor on the surface of the wafer W or by supplying the developing mist onto the surface of the wafer W.

(Evaluation Test 2)

Exposed wafers W1 and W2 were prepared as in the evaluation test 1. The wafer W1 was mounted on a spin chuck, and a developing solution was supplied through a nozzle while rotating the wafer W1 about a vertical axis by the spin chuck. While supplying the developing solution, a supply position of the developing solution was moved from a periphery of the wafer W1 toward a center thereof in a diametric direction, and, then, the developing solution toward the center of the wafer W1 was continuously supplied for a preset time. After the completion of the supply of the developing solution, the developing solution was removed by supplying a cleaning solution onto the wafer W1. Then, an image of a cross section of resist was captured.

Further, the wafer W2 was transferred into a processing vessel including a vessel main body and a top lid. After an airtightly sealed processing space is formed within the processing vessel by closing the top lid, a processing atmosphere was created by supplying developing mist into the processing space while evacuating the processing space, as in the first embodiment. After the supply of the developing mist, the developing solution was removed by supplying the cleaning solution onto the wafer W2, and an image of a cross section of resist was captured.

Figure 16A:
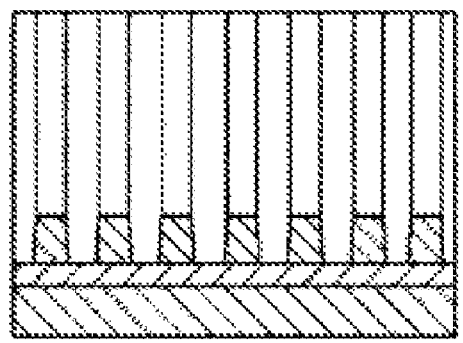
FIGS. 16A to 16D are longitudinal cross sectional views of wafers obtained in an evaluation test.
Figure 16B:
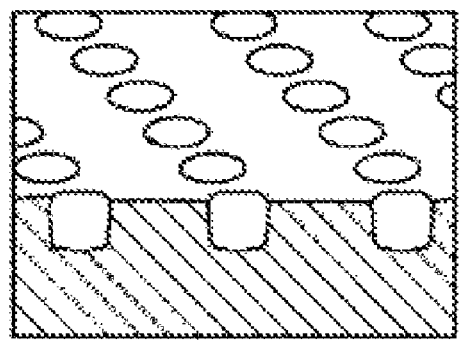
Figure 16C:
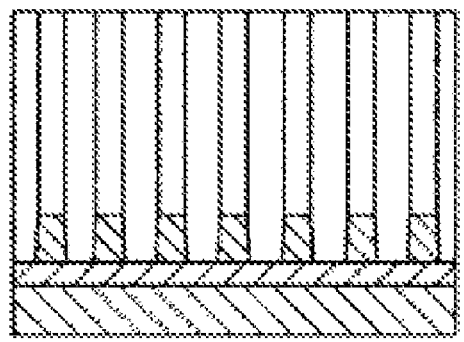
Figure 16D:
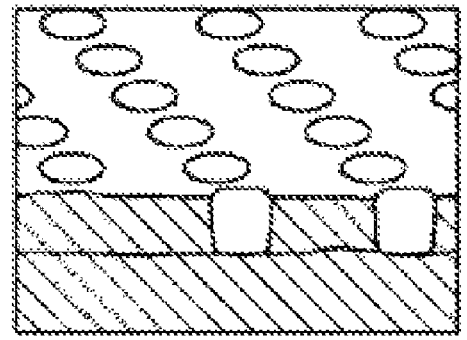

FIGS. 16A and 16B show images of the wafer W1, and FIGS. 16C and 16D show images of the wafer W2. As can be seen from the figures, there is almost no difference between pattern shapes formed on the wafers W1 and W2. From this experiment, it is proved that a developing process can be performed by using the mist of the developing solution in the same way as in the case of supplying the developing solution through the nozzle.

(Evaluation Test 3)

A plurality of exposed wafers W was prepared as in the evaluation tests 1 and 2. The wafers W were sequentially transferred into a processing vessel including a vessel main body and a top lid. After an airtightly sealed processing space is formed by closing the top lid, a processing atmosphere was created by supplying developing mist into the processing space while evacuating the processing space. The supply time of the developing mist was varied from about 45 seconds to about 60 seconds and to about 90 seconds for each wafer W. After the developing mist was supplied, the processing space was opened to an external atmosphere by opening the top lid and the wafer W was taken out and a cleaning process was performed on the wafer W. A CD average of a resist pattern at each portion on the surface of each wafer W was calculated and 3σ as an index of non-uniformity was also calculated for CD. Experiments in which the supply time of the developing mist was set to be 45 seconds, 60 second and 90 seconds will be referred to as evaluation tests 3-1, 3-2 and 3-3, respectively.

(Evaluation Test 4)

As in the evaluation test 3, a CD average and 3σ were calculated for wafers W on which a cleaning process was performed after a developing solution was supplied through a nozzle as in the evaluation test 2. The supply time of the developing solution through the nozzle was varied for each wafer W. Experiments with different supply times will be referred to as evaluation test 4-1, 4-2 and 4-3 in the order in which the supply time is shortest.

(Evaluation Test 5)

A developing solution was discharged onto wafers W through a nozzle having a discharge opening elongated in a diametric direction of the wafer W while moving the nozzle from one end of the wafer W to the other end thereof. After liquid is accumulated on the wafers W, a cleaning process was performed. The supply time of the developing solution was varied for each wafer W. Experiments in which the supply time of the developing solution was set to be about 30 seconds and about 60 seconds will be referred to as evaluation test 5-1 and 5-2, respectively.

Figure 17:
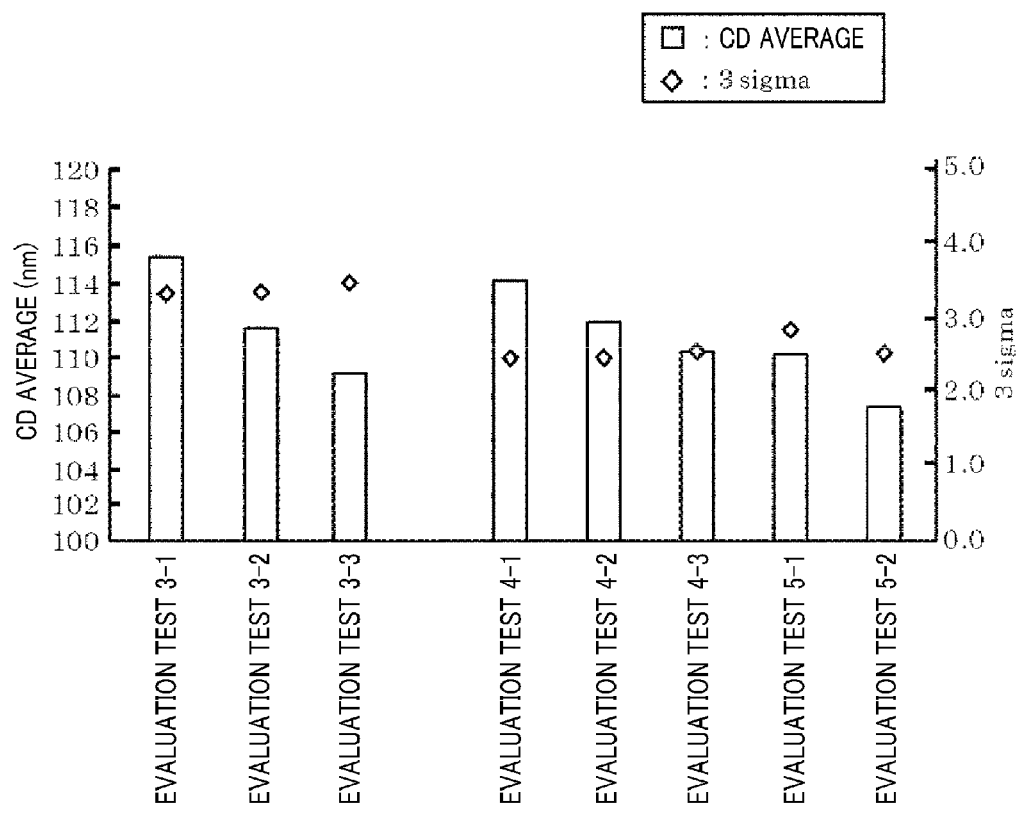
FIG. 17 is a graph showing CD averages and 3σ values of patterns obtained in an evaluation test.

FIG. 17 shows results of the evaluation tests 3 to 5. In FIG. 17, bar graphs indicate CD averages in the respective evaluation tests, and dots indicate 3σ values in the respective evaluation tests. From these results, it is found out that the CD average decreases with the rise of the supply time of the developing solution when the mist of the developing solution is supplied, as in the case of supplying the developing solution through the nozzle. Further, as for the 3σ values, there is found no great difference between the two cases when the mist of the developing solution is supplied and when the developing solution is supplied through the nozzle. From the results of the evaluation tests, it is proved that a developing process using the developing mist does not have a great influence on a pattern shape as compared to a developing process performed by supplying the developing solution through the nozzle.

(Evaluation Test 6)

As in the evaluation test 3, developing mist was supplied into a processing space in which an exposed wafer W is loaded while evacuating the processing space. The supply time of the developing mist was set to about 30 seconds. After the supply of the developing mist was stopped, a surface of the wafer W was dried by opening the processing space to an external atmosphere, and a cleaning process was performed on the wafer W afterward. Then, as in the evaluation test 3, a CD average of a resist pattern and 3σ of CD values were calculated for each wafer W. A time period from the stoppage of the supply of the developing mist till the opening of the processing space was set to be about 30 seconds and about 180 seconds for each wafer W. Experiments in which the time period till the opening of the processing space was set to about 30 seconds and about 180 seconds will be referred to as evaluation tests 6-1 and 6-2, respectively.

Further, the same experiments as the evaluation tests 6-1 and 6-2 were performed by setting the supply time of the developing mist to about 60 seconds. A time period from the stoppage of the supply of the developing mist till the opening of the processing space was set to be about 0 second, about 30 seconds and about 180 seconds for each wafer W. Experiments in which the time period till the opening of the processing space was set to 0 second, about 30 seconds and about 180 seconds will be referred to as evaluation tests 6-3, 6-4 and 6-5, respectively.

Figure 18:
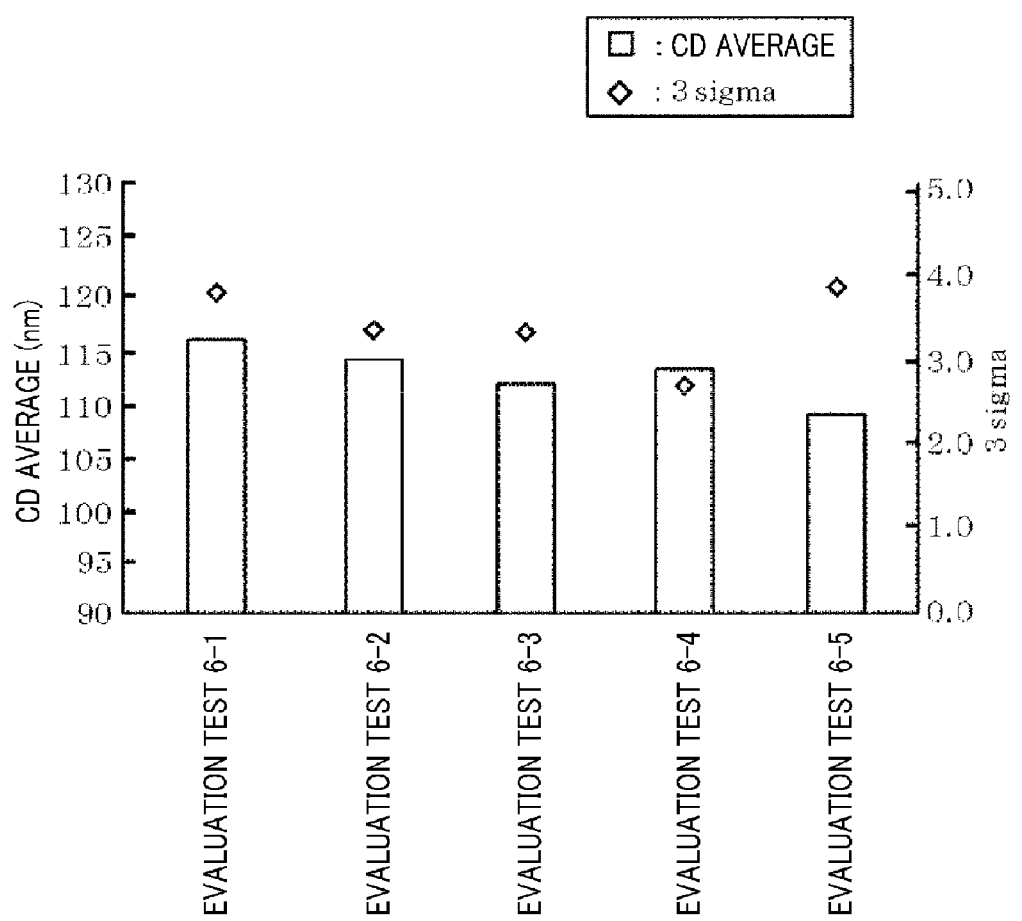
FIG. 18 is a graph showing CD averages and 3σ values of patterns obtained in an evaluation test.

FIG. 18 shows a result of the evaluation test 6. In FIG. 18, bar graphs indicate CD averages and dots indicate 3σ values. In the evaluation test 6-5, a 3σ value is found to be slightly greater than 3σ values in the evaluation tests 6-1 to 6-4, which indicates that CD non-uniformity of the resist pattern is slightly higher in the evaluation test 6-5. Furthermore, the CD averages are found to decrease with the rise of the time period till the opening of the processing space. It is deemed to be because surfaces of the wafers W were not dried due to the developing mist remaining in the processing space and the developing process further progressed even after the supply of the developing mist was stopped. From the result of the evaluation test 6, it is found out that a pattern shape is affected by a time period taken until a surface of a wafer W is dried.

(Evaluation Test 7)

As in the evaluation test 3, developing mist was supplied into a processing space in which an exposed wafer W is loaded while evacuating the processing space. The supply time of the developing mist was set to about 60 seconds. After the supply of the developing mist was stopped, a surface of the wafer W was dried by opening the processing space to an external atmosphere, and a cleaning process was performed on the wafer W afterward. A time period from opening of the processing space till the cleaning process was performed was set to be about 10 seconds, about 45 seconds, about 90 seconds, about 180 seconds and about 600 seconds for each wafer W. Then, as in the evaluation test 3, a CD average of a resist pattern and 3σ of CD values were calculated for each wafer W. Experiments in which the time period till the cleaning process was performed was set to about 10 seconds, about 45 seconds, about 90 seconds, about 180 seconds and about 600 seconds will be referred to as evaluation tests 7-1, 7-2, 7-3, 7-4 and 7-5, respectively.

Figure 19:
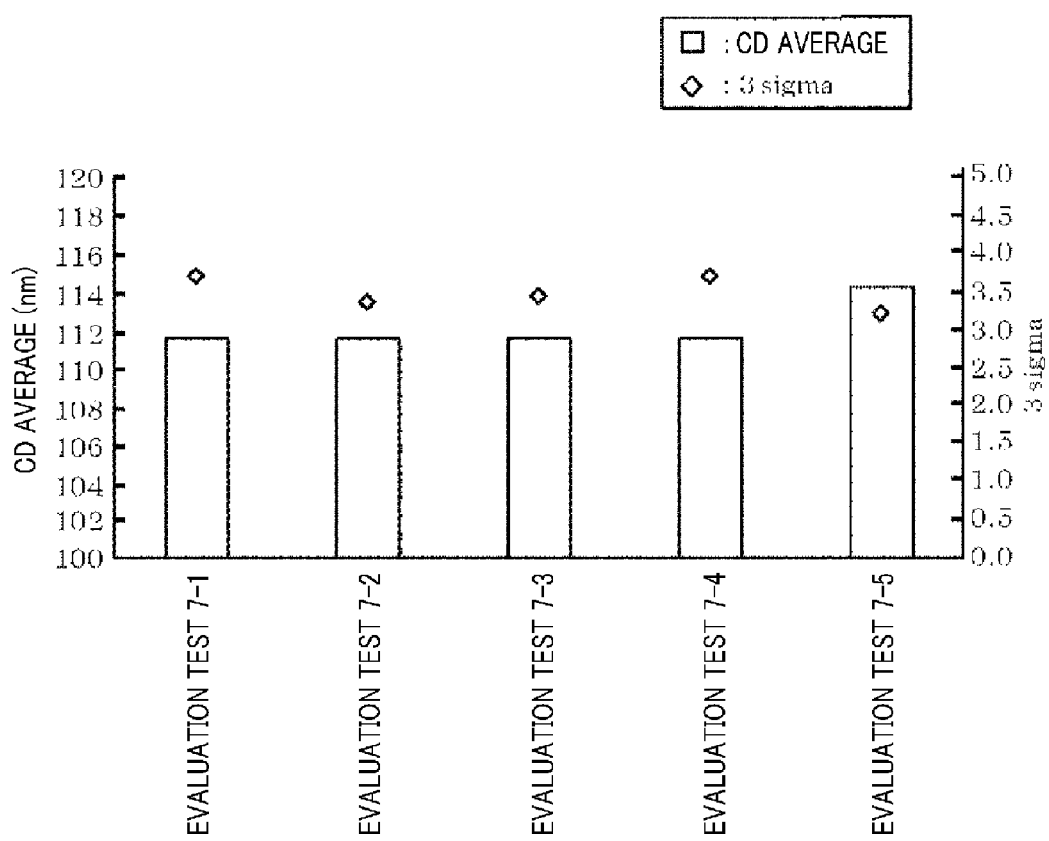
FIG. 19 is a graph showing CD averages and 3σ values of patterns obtained in an evaluation test.

FIG. 19 shows a result of the evaluation test 7. In FIG. 19, bar graphs indicate CD averages and dots indicate 3σ values. The CD average and the 3σ value are found to be not greatly varied between the experiments, which indicates that a time period taken until a cleaning process is performed after a wafer W is dried does not have a great influence on a pattern shape. Accordingly, as can be seen from this result, after a surface of the wafer W is dried, the wafer W is transferred into to a cleaning apparatus and the cleaning process can be performed on the wafer W, as in the above-described embodiments.

What is claimed is:

1. A developing apparatus that develops an exposed substrate, the apparatus comprising:
   an airtightly sealed processing vessel that forms a processing atmosphere therein;
   a temperature control plate that is provided within the processing vessel and mounts the substrate thereon;
   an atmosphere gas supply unit that supplies an atmosphere gas including mist and vapor of a developing solution onto a surface of the substrate within the processing vessel;
   a first temperature control unit that controls the temperature control plate to a temperature allowing the atmosphere gas to be condensed on the substrate; and
   a temperature setting unit that sets a temperature of the temperature control plate through the first temperature control unit such that a liquid film of the developing solution on the surface of the substrate is formed in a thickness in accordance with a processing recipe,
   wherein an inner wall of the processing vessel is maintained at a temperature at which the atmosphere gas is hardly condensed on the inner wall.

2. The developing apparatus of claim 1, further comprising:
   a second temperature control unit that maintains the inner wall of the processing vessel at a temperature at which the vapor is hardly condensed on the inner wall.

3. The developing apparatus of claim 1, wherein the temperature control plate includes an attracting mechanism that attracts the substrate onto a surface of the temperature control plate.

4. The developing apparatus of claim 1, wherein the atmosphere gas includes the vapor of the developing solution without containing the mist of the developing solution.

5. The developing apparatus of claim 1, wherein the atmosphere gas supply unit includes a heating unit that heats the atmosphere gas.

6. The developing apparatus of claim 5, wherein the atmosphere gas is heated to a temperature higher than a saturation temperature of the developing solution in a heating atmosphere by the heating unit.

7. A developing method for developing an exposed substrate, the method comprising:
   loading the substrate into an airtightly sealed processing vessel that forms a processing atmosphere therein;
   supplying an atmosphere gas including mist and vapor of a developing solution onto a surface of the substrate loaded into the processing vessel;
   controlling a temperature control plate, which is provided within the processing vessel and mounts the substrate thereon, to a temperature allowing the atmosphere gas to be condensed on the substrate;
   condensing the vapor by mounting the substrate on the temperature control plate and forming a liquid film of the developing solution by the mist and the condensed vapor; and
   setting a temperature of the temperature control plate such that the liquid film of the developing solution on the surface of the substrate is formed in a thickness in accordance with a processing recipe,
   wherein an inner wall of the processing vessel is maintained at a temperature at which the vapor is hardly condensed on the inner wall.

8. The developing method of claim 7, wherein the atmosphere gas includes the vapor of the developing solution without containing the mist of the developing solution.

9. The developing method of claim 7, further comprising: heating the atmosphere gas by a heating unit.

10. The developing method of claim 9, wherein the atmosphere gas is heated to a temperature higher than a saturation temperature of the developing solution in a heating atmosphere.

11. A storage medium that stores therein a program to be used in a developing apparatus that develops an exposed substrate within a processing vessel,
    wherein the program includes processing steps for implementing a developing method as claimed in claim 7.

* * * * *